(12) United States Patent
Cheng et al.

(10) Patent No.: US 10,818,663 B2
(45) Date of Patent: Oct. 27, 2020

(54) FABRICATION OF FIN FIELD EFFECT TRANSISTORS FOR COMPLEMENTARY METAL OXIDE SEMICONDUCTOR DEVICES INCLUDING SEPARATE N-TYPE AND P-TYPE SOURCE/DRAINS USING A SINGLE SPACER DEPOSITION

(71) Applicant: INTERNATIONAL BUSINESS MACHINES CORPORATION, Armonk, NY (US)

(72) Inventors: Kangguo Cheng, Schenectady, NY (US); Fee Li Lie, Albany, NY (US); Eric R. Miller, Schenectady, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 15/786,019

(22) Filed: Oct. 17, 2017

(65) Prior Publication Data
US 2018/0069004 A1   Mar. 8, 2018

Related U.S. Application Data

(62) Division of application No. 15/256,284, filed on Sep. 2, 2016, now Pat. No. 10,083,962.

(51) Int. Cl.
*H01L 27/088* (2006.01)
*H01L 29/66* (2006.01)
(Continued)

(52) U.S. Cl.
CPC .. *H01L 27/0922* (2013.01); *H01L 21/823814* (2013.01); *H01L 21/823821* (2013.01);
(Continued)

(58) Field of Classification Search
CPC ............... H01L 27/1211; H01L 29/785; H01L 29/66795; H01L 29/66545; H01L 21/845;
(Continued)

(56) References Cited

U.S. PATENT DOCUMENTS 9,087,741 B2   7/2015   Cheng et al.
9,087,921 B2   7/2015   Cheng et al.
(Continued)

OTHER PUBLICATIONS

List of IBM Patents or Patent Applications Treated as Related dated Oct. 17, 2017, 2 pages.

*Primary Examiner* — Nelson Garces
(74) *Attorney, Agent, or Firm* — Tutunjian & Bitetto, P.C.; Robert Sullivan

(57) ABSTRACT

A method of forming a complementary metal oxide semiconductor (CMOS) device on a substrate, including forming a plurality of vertical fins on the substrate, forming a first set of source/drain projections on the first subset of vertical fins, forming a second set of source/drain projections on the second subset of vertical fins, where the second set of source/drain projections is a different oxidizable material from the oxidizable material of the first set of source/drain projections, converting a portion of each of the second set of source/drain projections and a portion of each of the first set of source/drain projections to an oxide, removing the converted oxide portion of the first set of source/drain projections to form a source/drain seed mandrel, and removing a portion of the converted oxide portion of the second set of source/drain projections to form a dummy post.

18 Claims, 20 Drawing Sheets

(51) Int. Cl.
*H01L 29/161* (2006.01)
*H01L 29/16* (2006.01)
*H01L 29/06* (2006.01)
*H01L 29/78* (2006.01)
*H01L 21/8238* (2006.01)
*H01L 27/092* (2006.01)
*H01L 29/08* (2006.01)
*H01L 21/84* (2006.01)
*H01L 27/12* (2006.01)
*H01L 29/165* (2006.01)

(52) U.S. Cl.
CPC .... *H01L 21/823828* (2013.01); *H01L 21/845* (2013.01); *H01L 27/0924* (2013.01); *H01L 27/1211* (2013.01); *H01L 29/0847* (2013.01); *H01L 29/161* (2013.01); *H01L 29/165* (2013.01); *H01L 29/66545* (2013.01); *H01L 29/66795* (2013.01); *H01L 29/785* (2013.01)

(58) Field of Classification Search
CPC ............. H01L 27/0924; H01L 29/7851; H01L 21/823821; H01L 21/823431; H01L 27/0886; H01L 27/10826; H01L 27/10879; H01L 29/267; H01L 21/8258; H01L 29/1054
USPC ....................................................... 257/369
See application file for complete search history.

(56) References Cited

U.S. PATENT DOCUMENTS

| | | |
|---|---|---|
| 9,263,465 B2 | 2/2016 | Cheng et al. |
| 9,263,466 B2 | 2/2016 | Cheng et al. |
| 9,299,719 B2 | 3/2016 | Cheng et al. |
| 2013/0168771 A1* | 7/2013 | Wu ...................... H01L 27/1211 257/351 |
| 2015/0129934 A1* | 5/2015 | Xie ...................... H01L 27/0886 257/192 |
| 2015/0303198 A1* | 10/2015 | Ching .................... H01L 29/16 257/192 |
| 2015/0380556 A1* | 12/2015 | Ching .................. H01L 29/7849 257/351 |
| 2016/0079427 A1* | 3/2016 | Ching .................. H01L 29/4966 438/151 |
| 2016/0099245 A1 | 4/2016 | Cheng et al. |
| 2016/0099322 A1 | 4/2016 | Cheng et al. |
| 2018/0151677 A1* | 5/2018 | Glass ................... H01L 29/775 |

\* cited by examiner

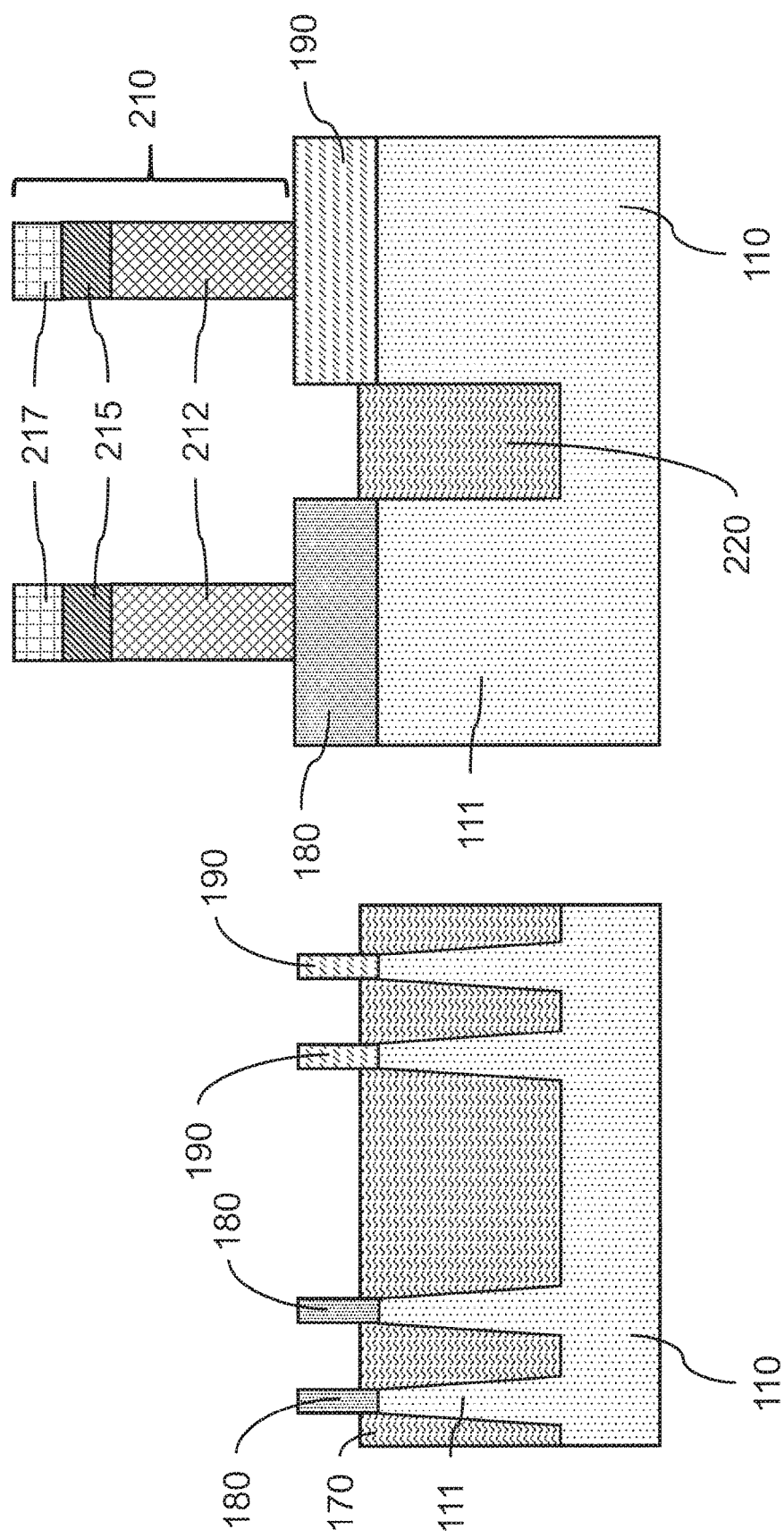

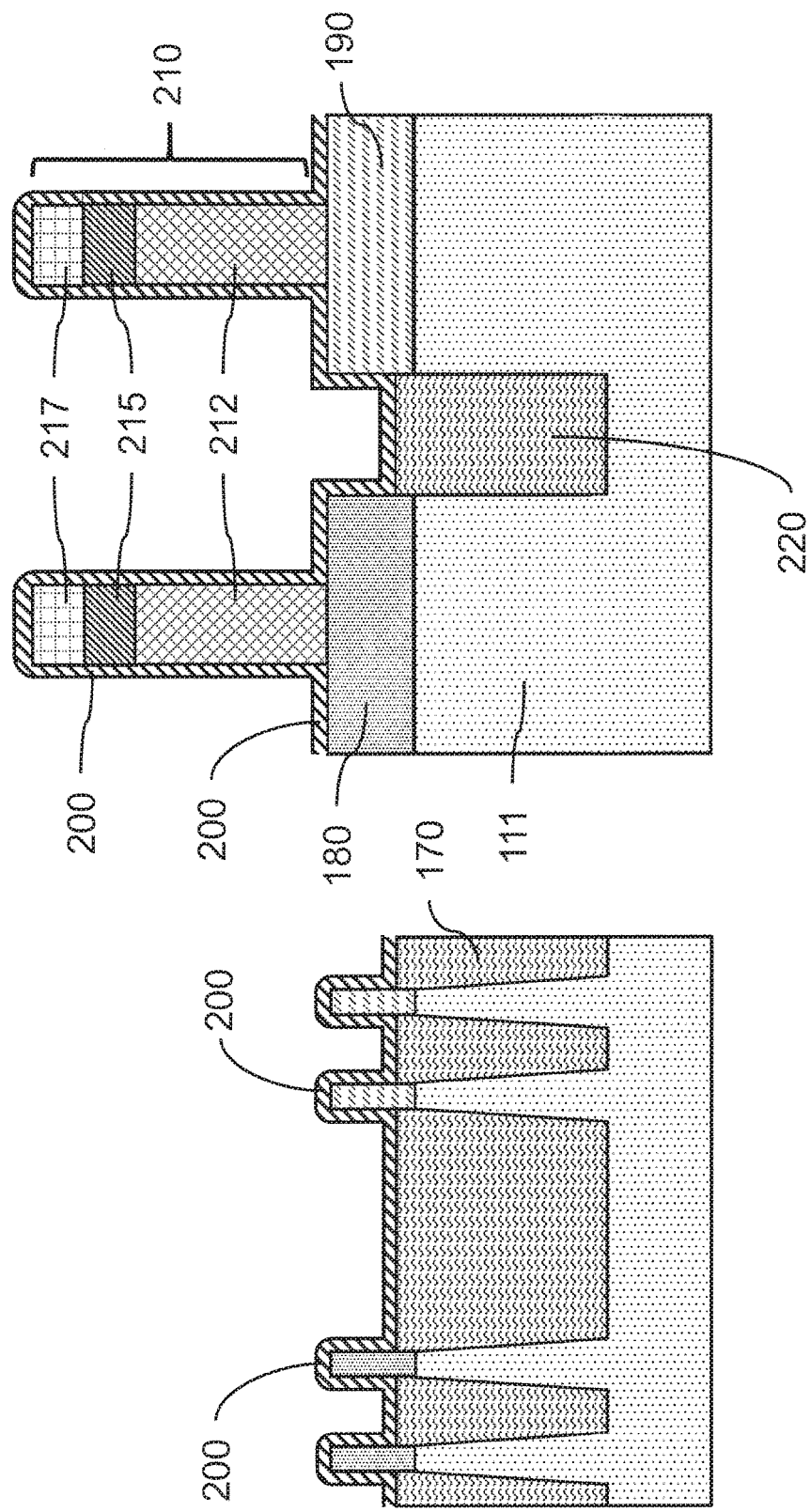

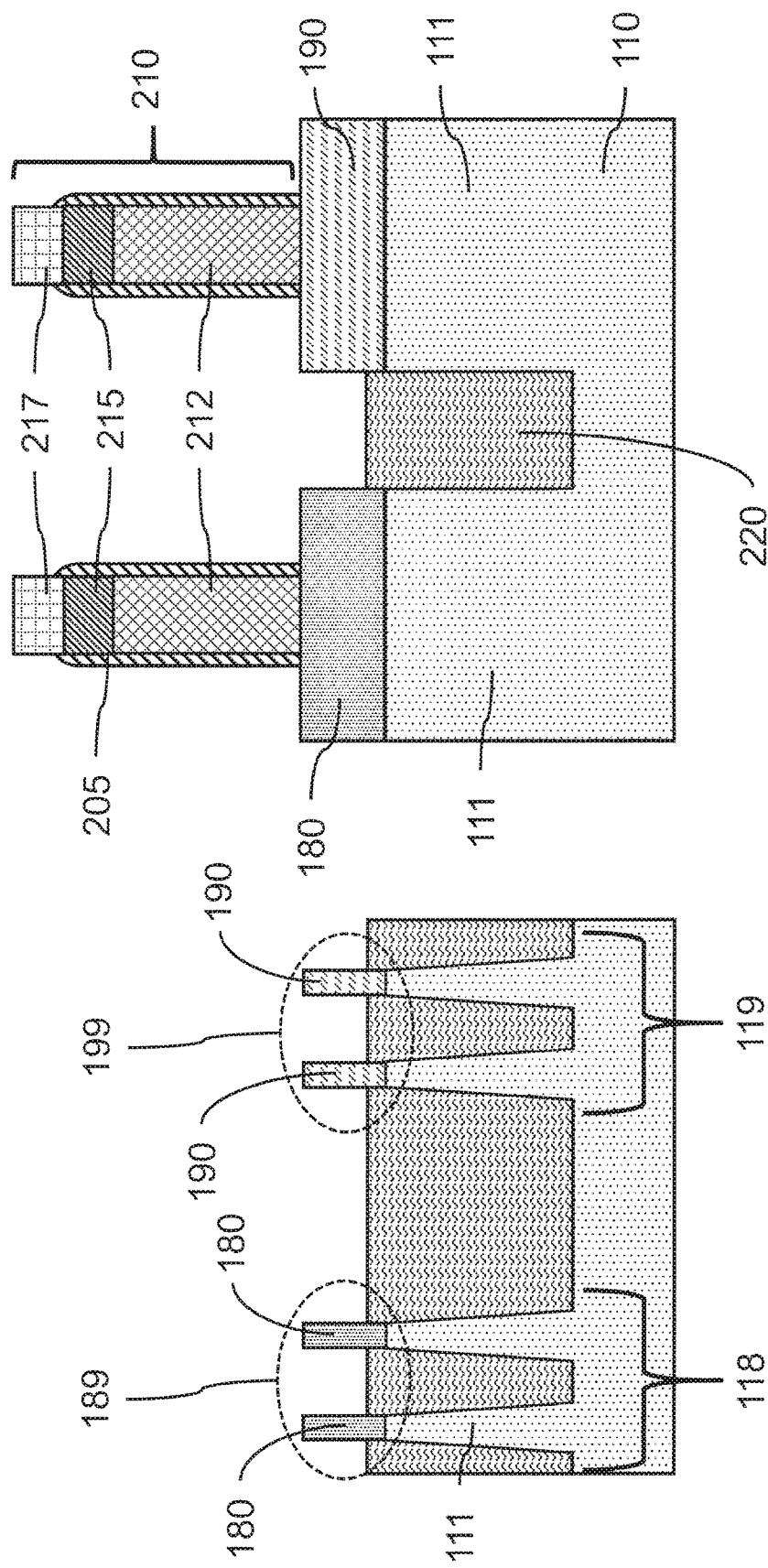

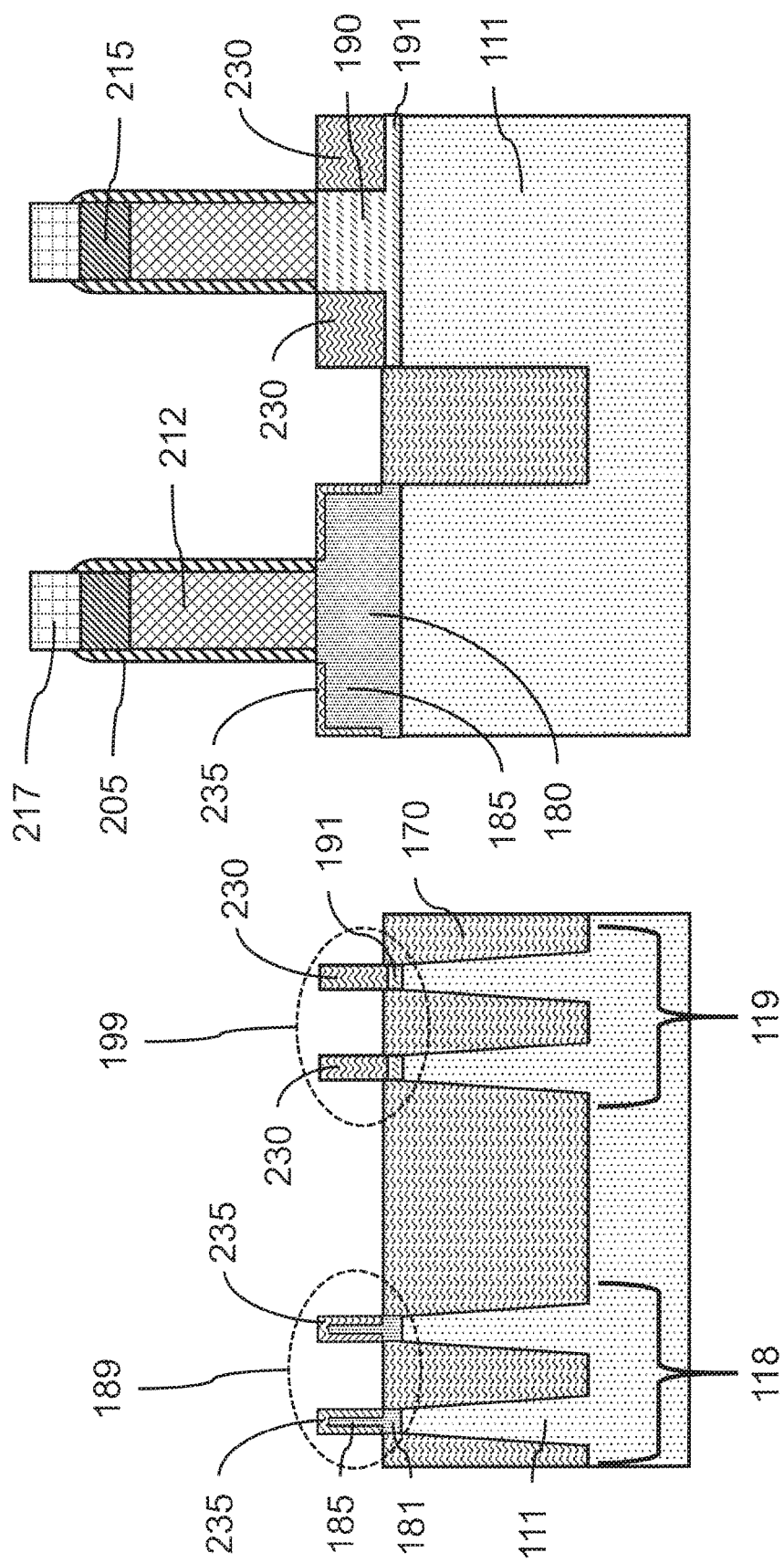

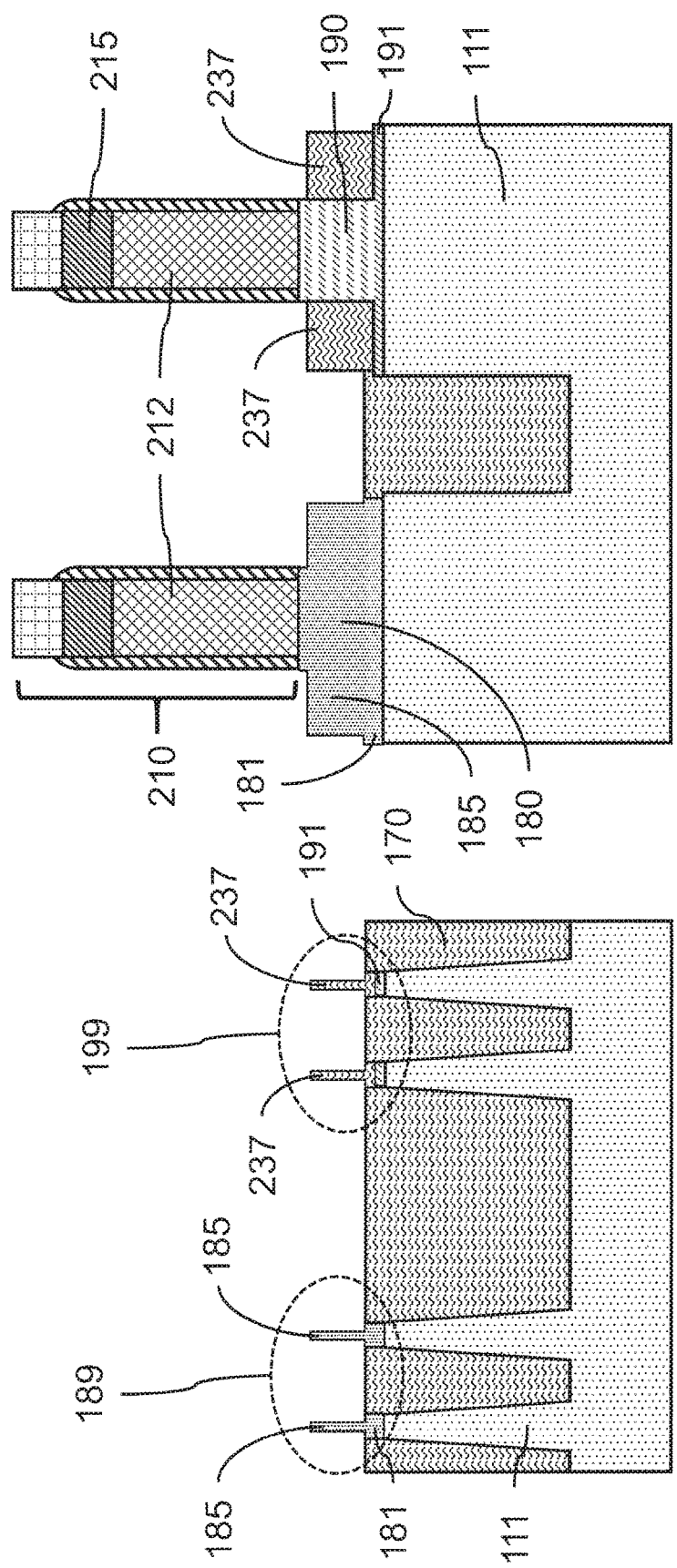

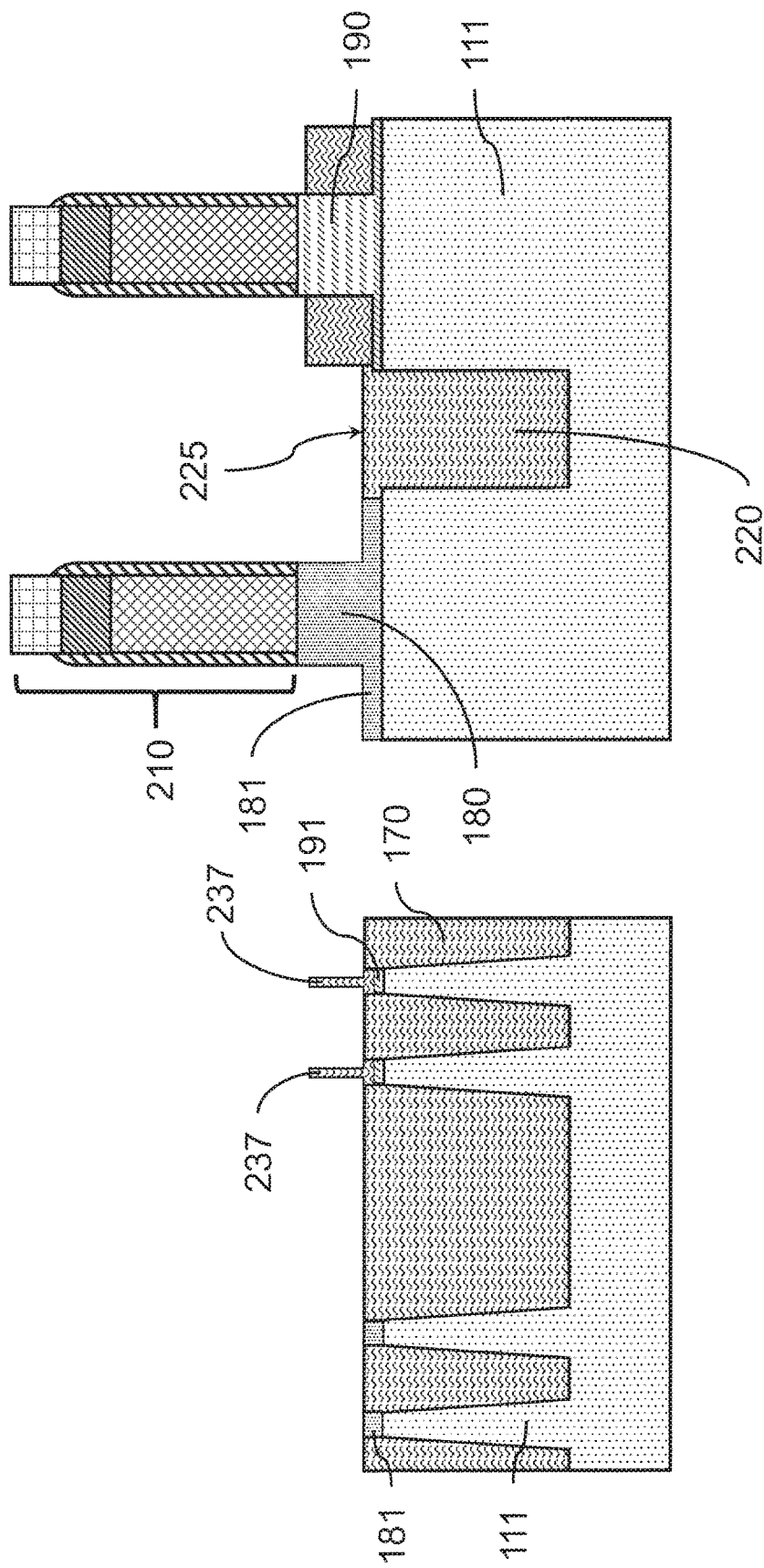

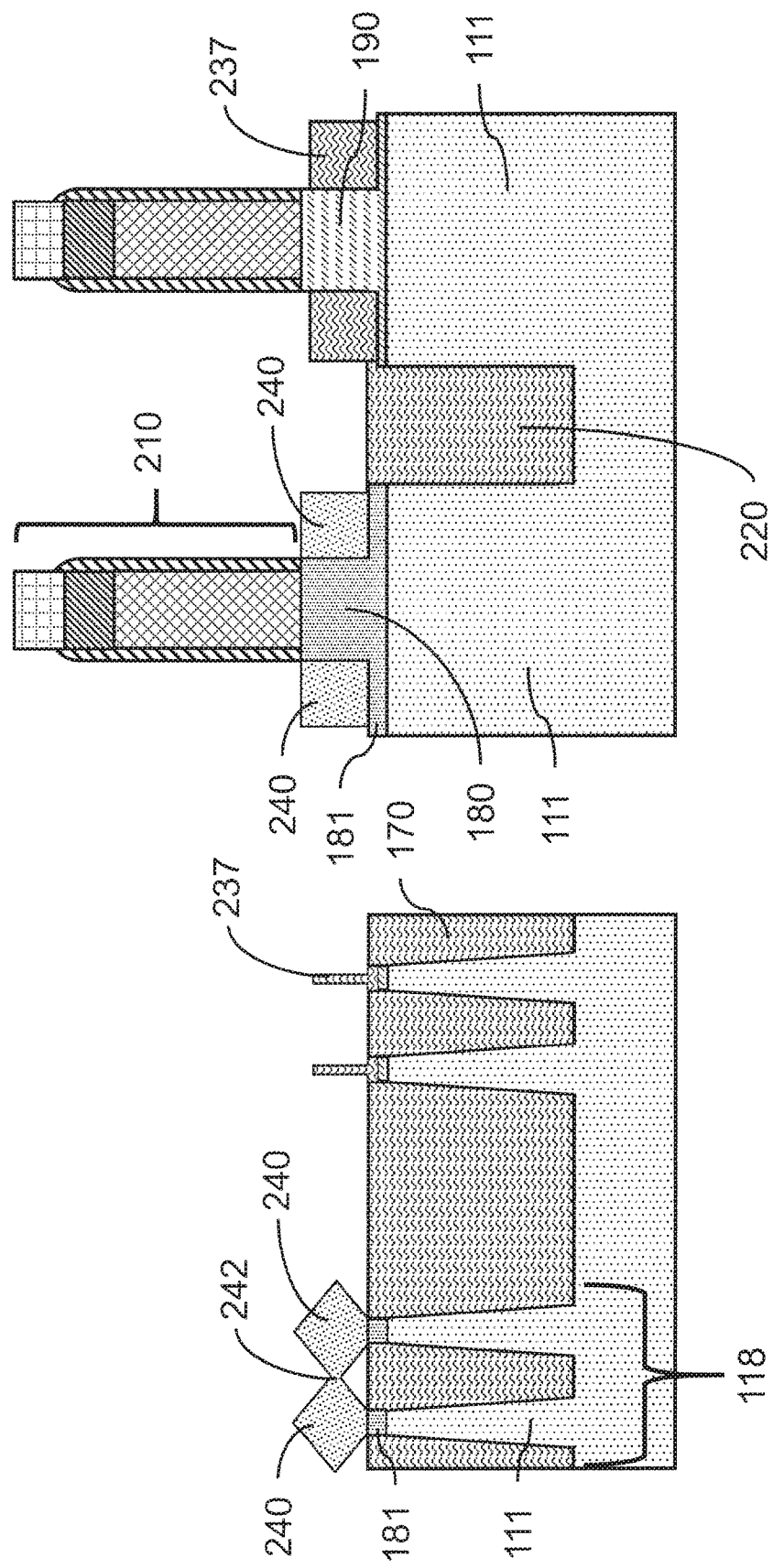

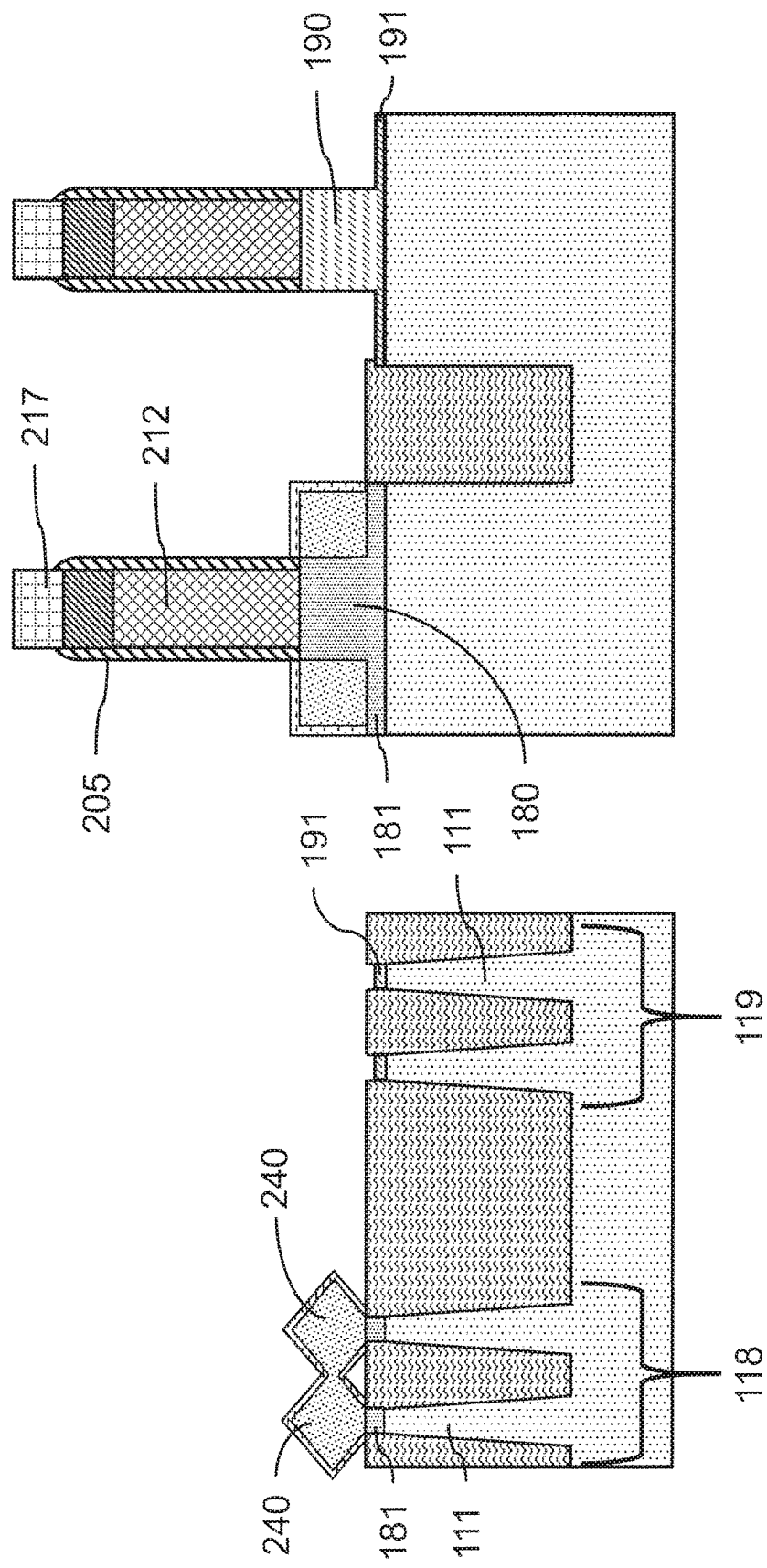

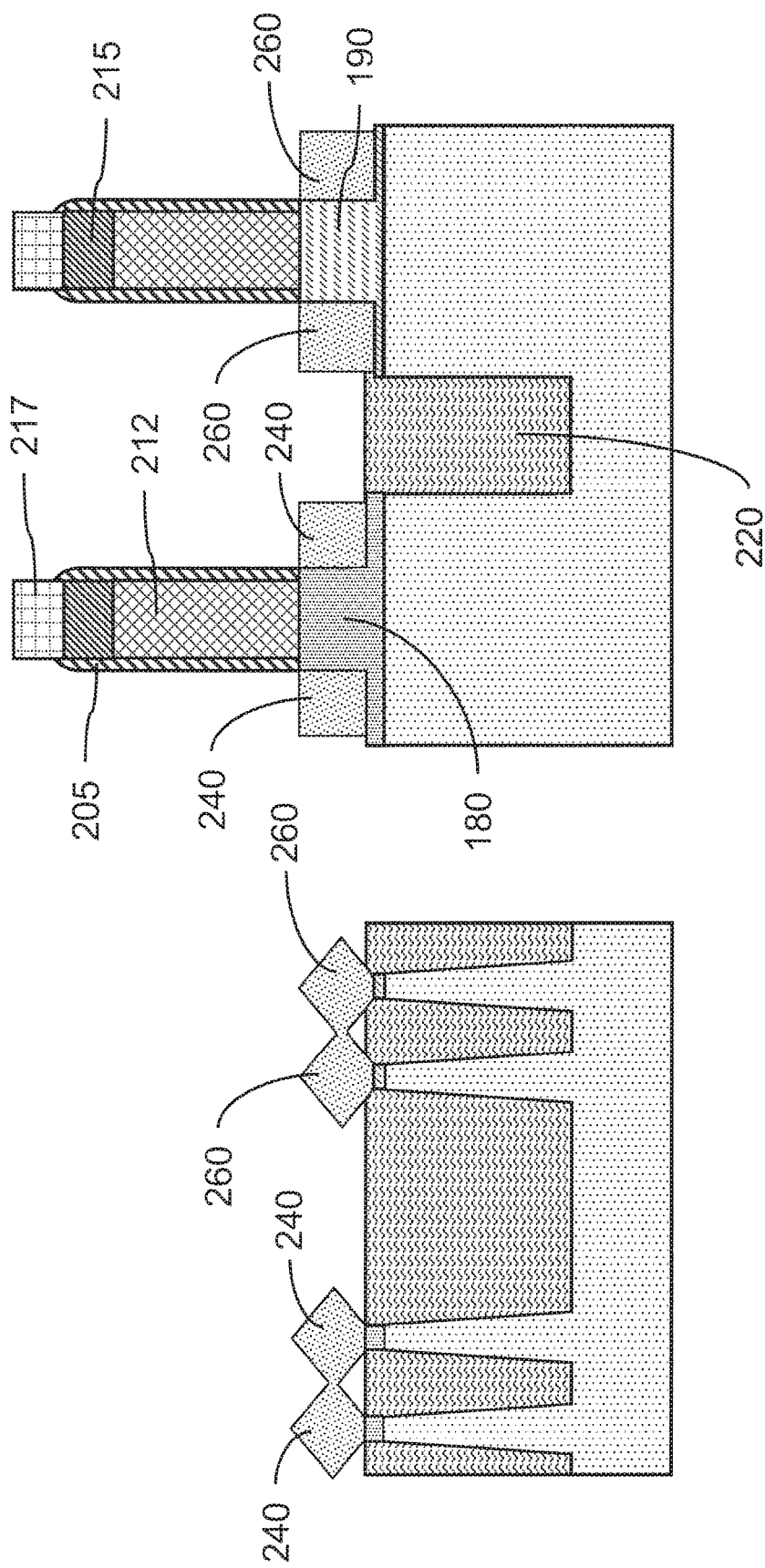

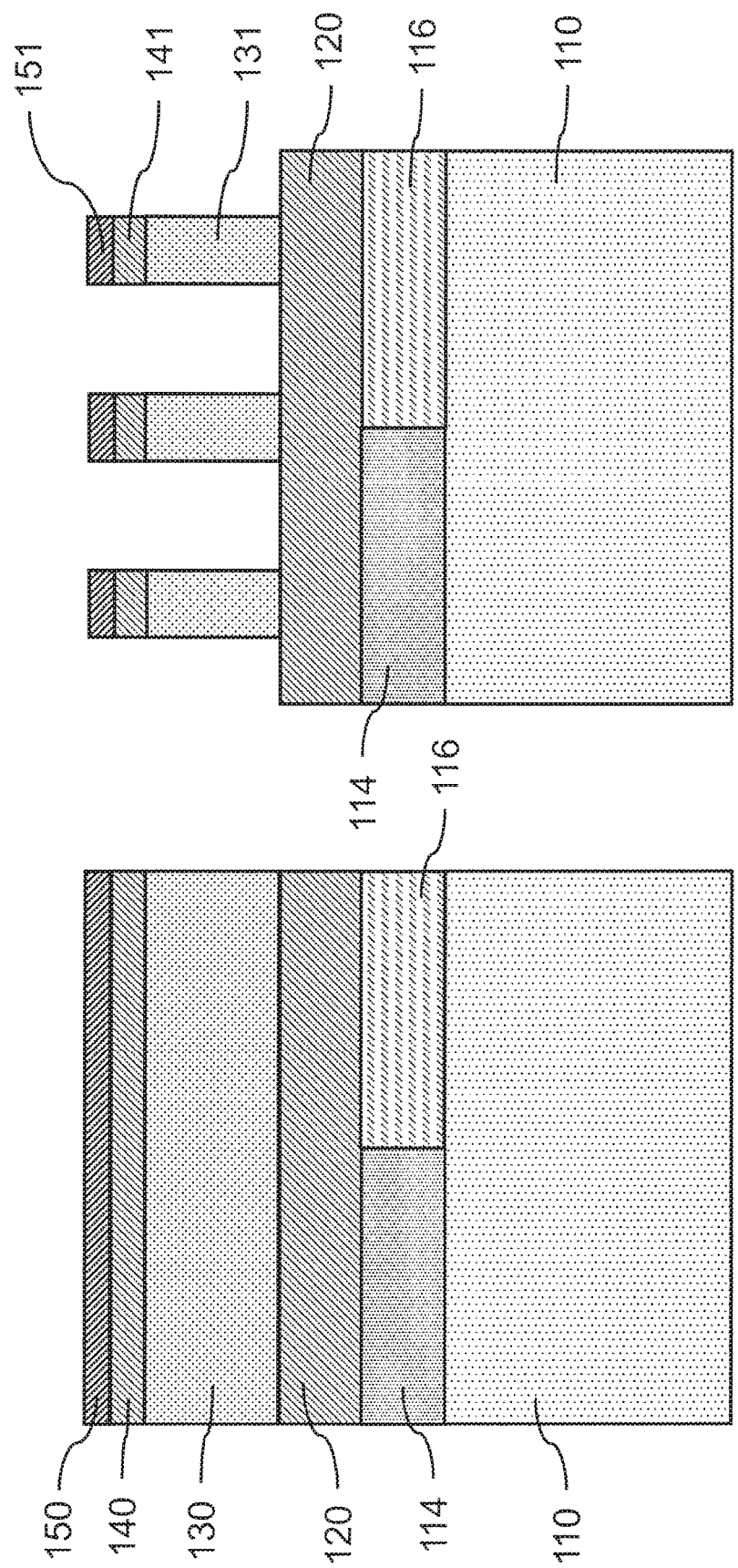

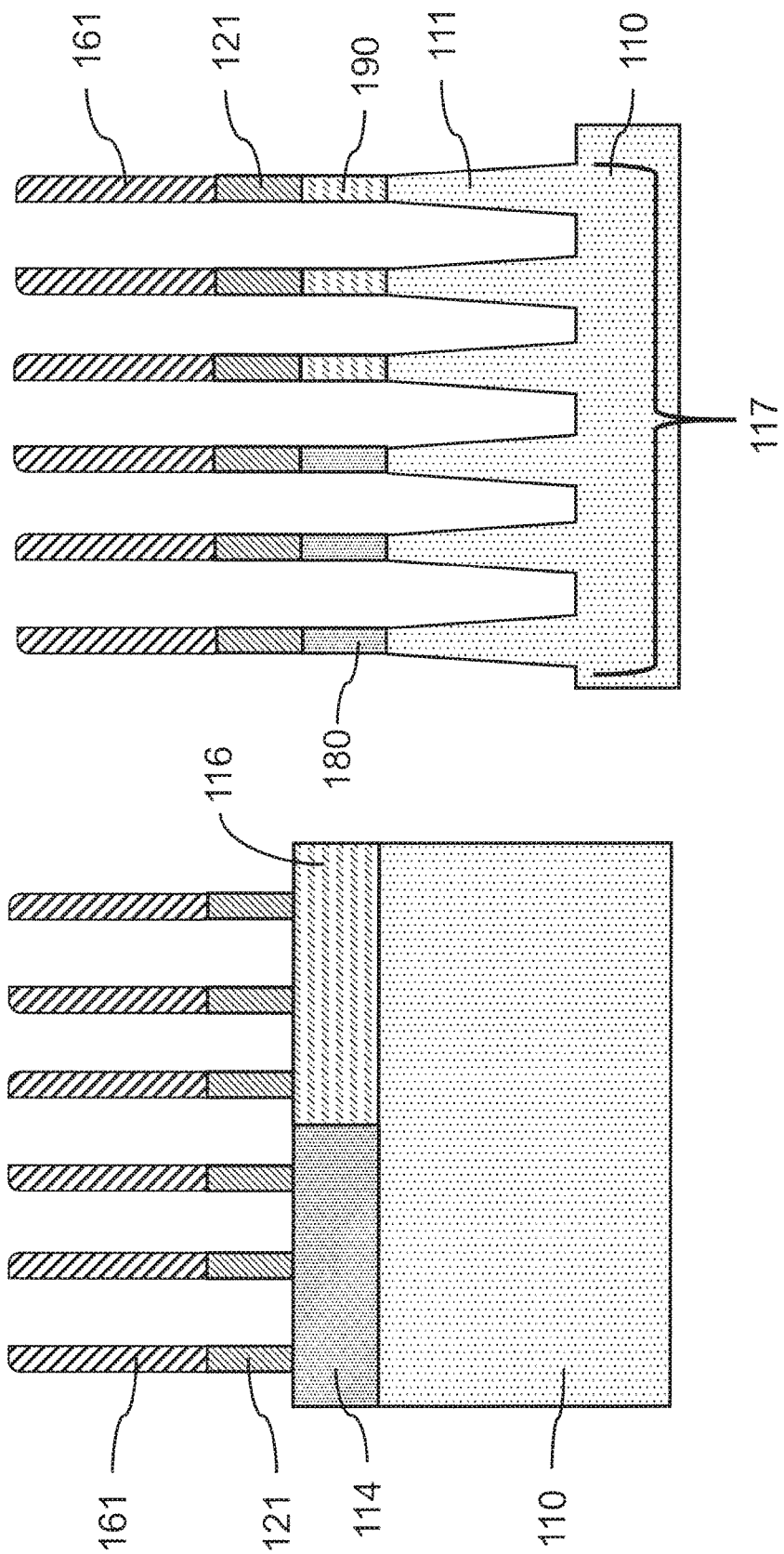

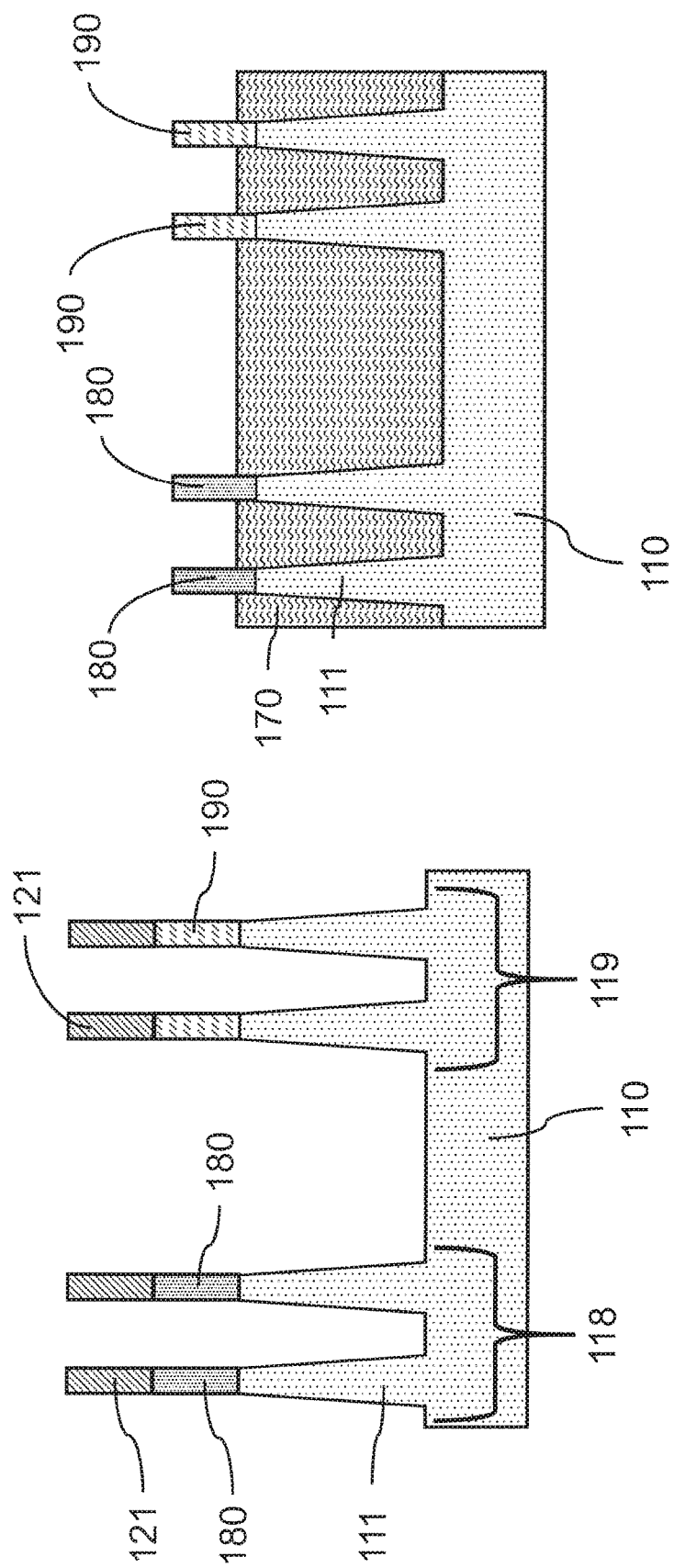

ND SEMICONDUCTOR
DEVICES INCLUDING SEPARATE N-TYPE
AND P-TYPE SOURCE/DRAINS USING A
SINGLE SPACER DEPOSITION

BACKGROUND

Technical Field

The present invention generally relates to a more efficient method of forming complementary metal oxide semiconductor (CMOS) devices from n-type and p-type fin field effect transistors (FinFETs), and more particularly to using source/drain projections of different materials to epitaxially grow n-type and p-type source/drains without separate masking steps.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate parallel to the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method is provided for forming a complementary metal oxide semiconductor (CMOS) device on a substrate. The method includes the step of forming a plurality of vertical fins on the substrate, where a first subset of vertical fins includes one or more vertical fins and a second subset of vertical fins includes one or more vertical fins. The method further includes the steps of forming a first set of source/drain projections on the first subset of vertical fins, and forming a second set of source/drain projections on the second subset of vertical fins, where the second set of source/drain projections is a different oxidizable material from the oxidizable material of the first set of source/drain projections. The method further includes the step of converting a portion of each of the second set of source/drain projections and a portion of each of the first set of source/drain projections to an oxide. The method further includes the steps of removing the converted oxide portion of the first set of source/drain projections to form a source/drain seed mandrel, and removing a portion of the converted oxide portion of the second set of source/drain projections to form a dummy post.

In accordance with another embodiment of the present invention, a method is provided for forming a complementary metal oxide semiconductor (CMOS) device on a substrate. The method includes the step of forming a plurality of vertical fins on the substrate, where a first subset of vertical fins includes one or more vertical fins and a second subset of vertical fins includes one or more vertical fins. The method further includes the step of forming a filler layer on the plurality of vertical fins. The method further includes the step of forming a first set of source/drain projections on the first subset of vertical fins, where the first set of source/drain projections is silicon. The method further includes the step of forming a second set of source/drain projections on the second subset of vertical fins, where the second set of source/drain projections is silicon-germanium, wherein at least a portion of the first set of source/drain projections and second set of source/drain projections is exposed above the filler layer. The method further includes the step of converting all of the exposed portion of the second set of source/drain projections and at least a portion of an exposed portion of the first set of source/drain projections to an amorphous material. The method further includes the steps of removing the converted oxide portion of the first set of source/drain projections to form a source/drain seed mandrel, and removing a portion of the converted oxide portion of the second set of source/drain projections to form a dummy post.

In accordance with yet another embodiment of the present invention, a complementary metal oxide semiconductor (CMOS) device is provided. The arrangement of the complementary metal oxide semiconductor (CMOS) device includes an arrangement of a plurality of vertical fins on a substrate, wherein the plurality of vertical fins are made of a semiconductor material. The arrangement further includes a first set of source/drain bases on a first subset of vertical fins. The arrangement further includes a second set of source/drain base on a second subset of vertical fins, where the second set of source/drain bases is a different oxidizable material than the oxidizable material of the first set of source/drain bases. The arrangement further includes a gate structure on at least a portion of each of the first set of source/drain bases. The arrangement further includes a gate structure on at least a portion of each of the second set of source/drain bases, and source/drains on opposite sides of each gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The description will provide details in the following description of preferred embodiments with reference to the following figures wherein:

FIG. 11 is a cross-sectional side view of partially exposed source/drain projections on vertical fins, in accordance with an embodiment of the present invention;

FIG. 12 is a cross-sectional side view of the long axis of the vertical fins and source/drain projections in FIG. 11, further showing a dummy gate structure on the source/drain projections and an isolation region between the vertical fins, in accordance with an embodiment of the present invention;

FIG. 13 is a cross-sectional side view of a protective layer covering portions of the source/drain projections exposed by reducing the height of the filler layer, in accordance with an embodiment of the present invention;

FIG. 14 is a cross-sectional side view of the long axis of the vertical fins in FIG. 13, further showing a dummy gate structure and isolation region covered by the protective layer, in accordance with an embodiment of the present invention;

FIG. 15 is a cross-sectional side view of partially exposed source/drain projections and filler layer, in accordance with an embodiment of the present invention;

FIG. 16 is a cross-sectional side view of the long axis of the vertical fins and source/drain projections in FIG. 15 showing exposed source/drain projections and a partially covered dummy gate structure on the source/drain projections, in accordance with an embodiment of the present invention;

FIG. 17 is a cross-sectional side view of a first set of source/drain projections partially converted to an amorphous material casing and a second set of source/drain projections partially converted to an amorphous material, in accordance with an embodiment of the present invention.

FIG. 18 is a cross-sectional side view of the long axis of the vertical fins and converted source/drain projections in FIG. 17 showing a source/drain seed mandrel and dummy source/drain mandrel, in accordance with an embodiment of the present invention;

FIG. 19 is a cross-sectional side view of source/drain seed mandrel after removal of the casing, and partially removed dummy source/drain mandrels, in accordance with an embodiment of the present invention;

FIG. 20 is a cross-sectional side view of the long axis of the source/drain seed mandrel and dummy post in FIG. 19 after removal of the casing, in accordance with an embodiment of the present invention;

FIG. 21 is a cross-sectional side view of a source/drain base after removal of the source/drain seed mandrel, and partial removal of the dummy source/drain mandrels, in accordance with an embodiment of the present invention;

FIG. 22 is a cross-sectional side view of the long axis of the vertical fins and dummy gate structures in FIG. 21 after removal of the source/drain seed mandrel, in accordance with an embodiment of the present invention;

FIG. 23 is a cross-sectional side view of a source/drain formed on the source/drain bases, and partially removed dummy source/drain mandrels, in accordance with an embodiment of the present invention;

FIG. 24 is a cross-sectional side view of the long axis of the vertical fins and dummy gate structures in FIG. 23 after formation of the source/drains, in accordance with an embodiment of the present invention;

FIG. 27 is a cross-sectional side view of the source/drains on the first subset of vertical fins after removal of the dummy posts from the second subset of vertical fins, in accordance with an embodiment of the present invention;

FIG. 28 is a cross-sectional side view of the long axis of the vertical fins and dummy gate structures in FIG. 27 after removal of the dummy posts, in accordance with an embodiment of the present invention;

FIG. 31 is a cross-sectional side view of source/drains formed on the first subset of vertical fins and second subset of vertical fins after removal of the liner, in accordance with an embodiment of the present invention;

FIG. 32 is a cross-sectional side view of the long axis of the vertical fins and dummy gate structures in FIG. 31 after removal of the liner, in accordance with an embodiment of the present invention;

FIG. 35 is a cross-sectional side view of a first source/drain projection layer and a second source/drain projection layer on the substrate, and a fin template layer on the first source/drain projection layer and a second source/drain projection layer, in accordance with an embodiment of the present invention;

FIG. 36 is a cross-sectional side view of a mandrel mask segment and mandrel template on each of a plurality of sacrificial mandrels on a fin template layer, in accordance with an embodiment of the present invention;

FIG. 37 is a cross-sectional side view of a spacer and fin template on a first source/drain projection layer and a second source/drain projection layer, in accordance with an embodiment of the present invention;

FIG. 38 is a cross-sectional side view of a spacer, fin template, and source/drain projection on each of a plurality of vertical fins formed from the substrate, in accordance with an embodiment of the present invention;

FIG. 39 is a cross-sectional side view of a fin template and source/drain projection on each of a plurality of vertical fins formed from the substrate, in accordance with an embodiment of the present invention; and FIG. 40 is a cross-sectional side view of partially exposed source/drain projections on vertical fins, in accordance with an embodiment of the present invention.

DETAILED DESCRIPTION

Figure 2:
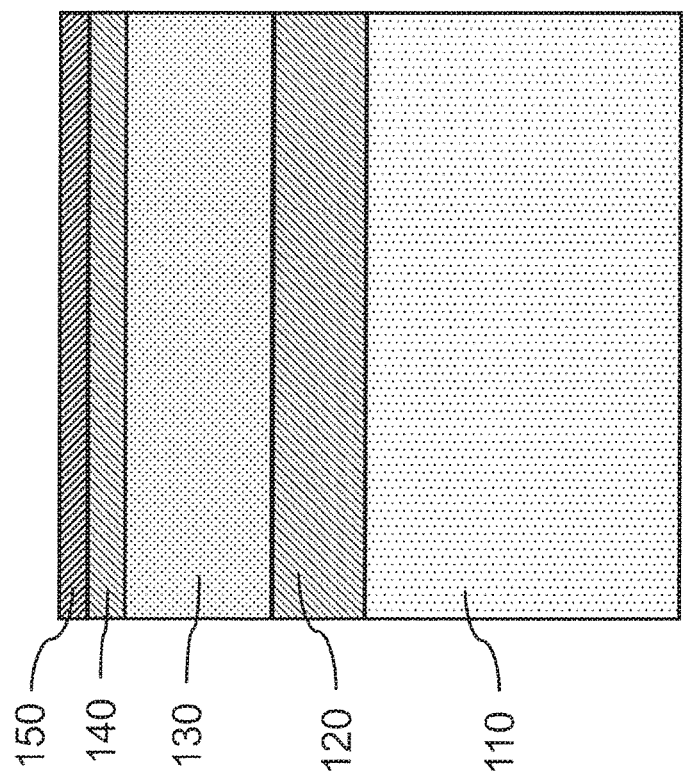
FIG. 2 is a cross-sectional side view of a mandrel mask segment and mandrel template on each of a plurality of sacrificial mandrels on a fin template layer, in accordance with an embodiment of the present invention.

Principles and embodiments of the present invention relate generally to formation of neighboring n-type and p-type fin field effect transistors (finFETs) to fabricate a complementary metal oxide semiconductor (CMOS) device without multiple liner and organic planarization layer (OPL) depositions and removals. A plurality of n-doped source/drains can be formed on a plurality of vertical fins adjacent to a plurality of p-doped source/drains utilizing selectively etchable source/drain projection on the vertical fins. The source/drain projections can be a section of single crystal material extending from the fin proper that can be selectively converted to another material that prevents epitaxial growth on the fin.

Principles and embodiments of the present invention also relate generally to a selective conversion of source/drain projection(s) on one or more predetermined vertical fin(s) to a casing not conducive to epitaxial growth, such that source/drains can be selectively formed on a first subset of exposed vertical fins without epitaxial growth on a second subset of exposed vertical fins, while avoiding iterative masking and removal steps, as well as lithographic misalignments.

Principles and embodiments of the present invention also relate generally to forming source/drain projections on predetermined vertical fins from two different materials that can be converted to an oxide at different rates. The present principles and embodiments can also be related to the use of silicon-germanium as source/drain projections on one or more vertical fins and silicon source/drain projections on one or more vertical fins, where the silicon-germanium source/drain projections can be oxidized at a faster rate than the silicon source/drain projections.

Exemplary applications/uses to which the present principles can be applied include, but are not limited to: formation of complementary metal-oxide-semiconductor (CMOS) field effect transistors (FETs) formed by coupled finFETs, and digital gate devices (e.g., NAND, NOR, XOR, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Figure 1:
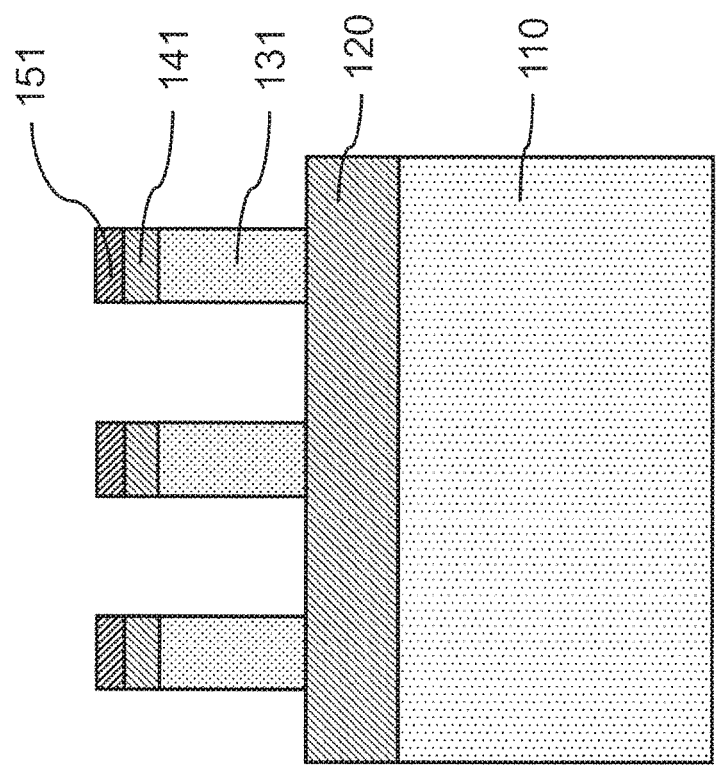
FIG. 1 is a cross-sectional side view of a fin template layer formed on the surface of a substrate, a mandrel layer formed on the fin template layer, a mandrel template layer formed on the mandrel layer, and a mandrel mask layer formed on the mandrel template layer, in accordance with an embodiment of the present invention.

Referring now to the drawings in which like numerals represent the same or similar elements and initially to FIG. 1, a cross-sectional side view of a fin template layer formed on the surface of a substrate, a mandrel layer formed on the fin template layer, a mandrel template layer formed on the mandrel layer, and a mandrel mask layer formed on the mandrel template layer is shown, in accordance with an embodiment of the present invention.

In one or more embodiments, a substrate 110 can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, the surface/active layer may include two different materials, where a first material can be on one or more segregated areas of the substrate, and a second material can be on one or more segregated areas of the substrate different from but adjacent to the first material.

In one or more embodiments, a fin template layer 120 can be formed on at least a portion of a surface of a substrate 110. In various embodiments, the fin template layer 120 can be formed on the substrate surface by CVD, PECVD, PVD, thermal growth, or combinations thereof, where the fin template layer 120 can be blanket deposited on the substrate.

In one or more embodiments, the fin template layer 120 can have a thickness in the range of about 20 nm to about 70 nm, or in the range of about 20 nm to about 50 nm, or in the range of about 50 nm to about 70 nm, or in the range of about 30 nm to about 60 nm, where the thickness of the fin template layer 120 can define the height of subsequently formed source/drain projections. Other thicknesses are also contemplated.

In various embodiments, a fin template layer 120 can be a hard mask layer for masking the substrate during transfer of a vertical fin pattern to the substrate 110. The fin template layer 120 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the fin template layer 120 may include one or more layers. The fin template layer 120 can also act as an etch-stop layer for forming sacrificial mandrels from a mandrel layer.

In one or more embodiments, a mandrel layer 130 can be formed on at least a portion of the fin template layer 120. In one or more embodiments, the mandrel layer 130 can be formed by CVD or PECVD, where the mandrel layer 130 can be blanket deposited on the fin template layer 120.

In various embodiments, mandrel layer 130 can be a sacrificial material that can be easily and selectively patterned and etched. The mandrel layer 130 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a mandrel template layer 140 can be formed on the mandrel layer 130, where the mandrel template layer can be a hard mask layer.

The mandrel template layer 140 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the mandrel template layer 140 may include one or more layers.

In one or more embodiments, a mandrel mask layer 150 can be formed on the mandrel template layer 140, where the mandrel mask layer 150 can be a hard mask layer or soft mask layer for masking the mandrel template layer 140. In one or more embodiments, the mandrel mask layer 150 can be a lithographic resist material (e.g., a photo resist material, an e-beam resist material, etc.).

In one or more embodiments, the mandrel mask layer 150 can be a positive or negative resist material, for example, Poly(methyl methacrylate) (PMMA) or SU-8, or an electron-beam (e-beam) cured material, for example, hydrogen silsesquioxane (HSQ).

FIG. 2 is a cross-sectional side view of a mandrel mask segment and mandrel template on each of a plurality of sacrificial mandrels on a fin template layer, in accordance with an embodiment of the present invention.

In various embodiments, a plurality of vertical fins can be formed by a sidewall image transfer (SIT) process, self-aligned double patterning (SADP), or self-aligned quadruple patterning (SAQP) to provide a tight pitch between vertical fins. In various embodiments, a direct print can be used to provide fins with a looser pitch.

In one or more embodiments, the mandrel mask layer 150 can be patterned and developed to form one or more mandrel mask segments 151 on the surface of the mandrel template layer 140, where portions of the mandrel mask layer 150 can be removed to expose underlying portions of the mandrel mask layer. In various embodiments, the mandrel mask layer 150 can be lithographically patterned and developed, as would be known in the art.

In various embodiments, the one or more mandrel mask segments 151 can form a mandrel pattern on the surface of the mandrel template layer 140, where the mandrel pattern can be transferred to the mandrel template layer 140 by removing the portions of the mandrel template layer exposed by forming the mandrel mask segments 151. The dimensions and pitch of the mandrel pattern can be determined by the resolution of the lithography techniques (e.g., ultraviolet (UV), deep ultraviolet (DUV), e-beam, etc.) used to pattern the mandrel mask layer 150.

In one or more embodiments, the mandrel mask segments 151 can have a width in the range of about 10 nm to about 30 nm, or in the range of about 12 nm to about 20 nm, where the mandrel width can define a distance between subsequently formed adjacent vertical fins.

In various embodiments, the pitch between adjacent mandrel mask segments 151 can be in the range of about 20 nm to about 60 nm, or in the range of about 20 nm to about 40 nm, or in the range of about 25 nm to about 30 nm, which can determine the pitch between vertical fins.

In one or more embodiments, the exposed portions of the mandrel template layer 140 can be removed by wet etching or by a dry plasma etch, where the dry plasma can be a directional reactive ion etch (RIE). Removal of the exposed portions of the mandrel template layer 140 can form one or more mandrel templates 141 below the mandrel mask segments 151, and expose underlying portions of the mandrel layer 130. The mandrel templates 141 can be used to transfer the mandrel pattern to the mandrel layer 130.

In one or more embodiments, the exposed portions of the mandrel layer 130 can be removed to form one or more sacrificial mandrels 131, where the exposed portions of the mandrel layer can be removed by a directional dry plasma etch, for example, a selective RIE. The one or more sacrificial mandrels 131 can be on the fin template layer 120, where portions of the fin template layer can be exposed between the sacrificial mandrel(s) 131.

In one or more embodiments, the distance between certain mandrel templates 141 can be greater than the distance between other adjacent mandrel templates to form a mandrel pattern with larger intervening gaps between different subsequently formed devices. In various embodiments, a fin-cut process can be used to form larger intervening gaps between different subsequently formed devices.

Figure 3:
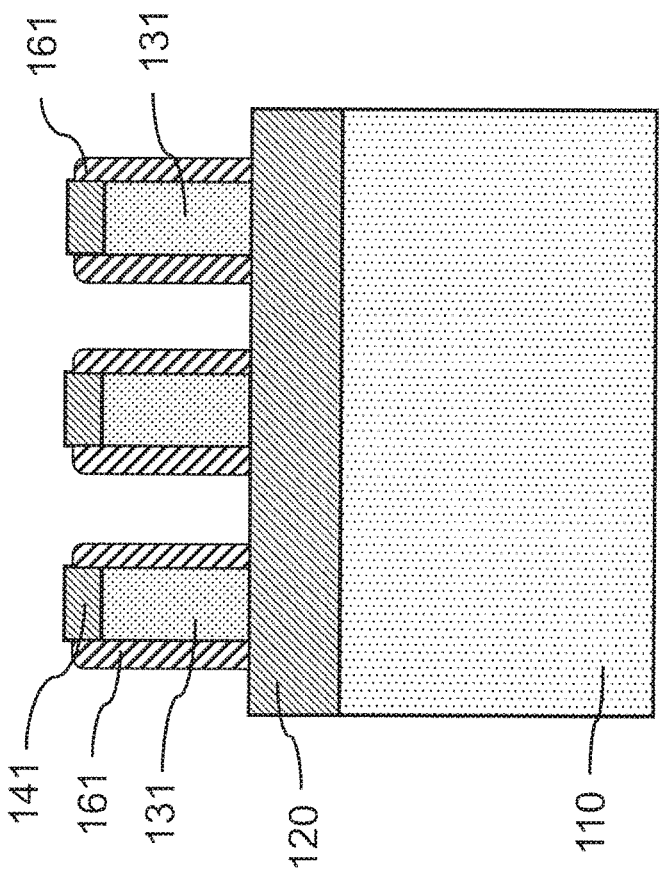
FIG. 3 is a cross-sectional side view of spacers formed on each of the sidewalls of the sacrificial mandrels, in accordance with an embodiment of the present invention.

FIG. 3 is a cross-sectional side view of spacers formed on each of the sidewalls of the sacrificial mandrels, in accordance with an embodiment of the present invention.

In one or more embodiments, spacers 161 can be formed on each of the one or more sacrificial mandrels 131.

In one or more embodiments, the spacers 161 can be formed by forming a spacer layer on the one or more sacrificial mandrels 131, where the spacer layer can be blanket deposited on each of the mandrel templates 141 on the sacrificial mandrels 131 and the exposed surfaces of the fin template layer 120. In various embodiments, the mandrel mask segments 151 can be removed from the mandrel templates 141 before formation of the spacer layer.

In various embodiments, the spacer layer can be formed by ALD, PEALD, CVD, PECVD, PVD, or combinations thereof. In various embodiments, the spacer layer can be conformally deposited on the sacrificial mandrels, for example, by ALD or PEALD, to accurately control the thickness of the spacer layer on the sidewalls of the sacrificial mandrels 131.

In various embodiments, the spacer layer can have a thickness in the range of about 4 nm to about 20 nm, or in the range of about 6 nm to about 15 nm, or in the range of about 8 nm to about 12 nm, where the thickness of the spacer layer can determine the pitch and/or width of subsequently formed vertical fins.

In one or more embodiments, a portion of the spacer layer on the template layer 120 and the top surfaces of the mandrel templates 141 can be removed by an etch-back process using a directional etch, for example, RIE to remove the portion of the spacer layer on surfaces approximately perpendicular to the incident ion beam, while the spacer layer on the vertical sidewalls of the sacrificial mandrels 131 remain essentially unetched. In one or more embodiments, a portion of the spacer layer on the top surfaces of the mandrel templates 141 can be removed by a chemical-mechanical polishing (CMP) to expose the mandrel templates 141.

In various embodiments, the spacer layer can be silicon oxide (SiO), silicon nitride (SiN), silicon oxynitride (SiON), or combinations thereof.

Figure 4:
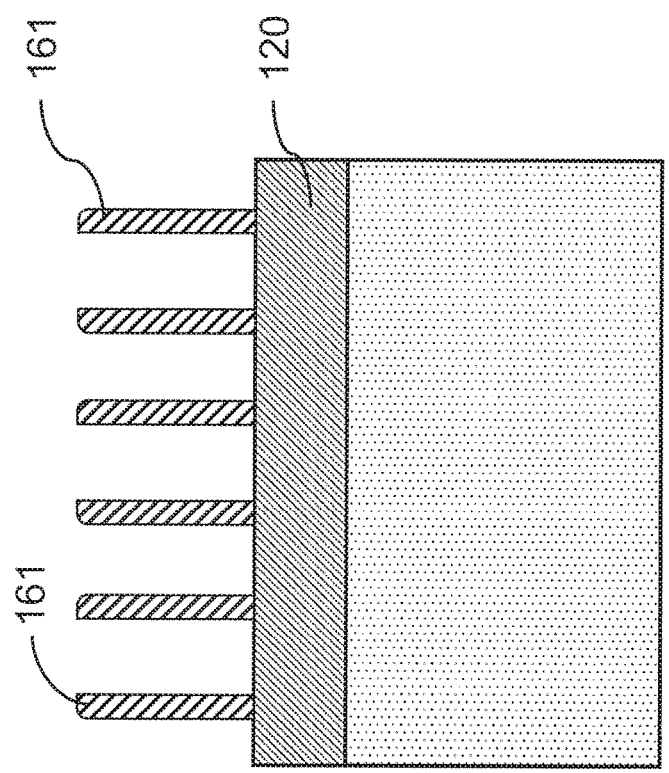
FIG. 4 is a cross-sectional side view of plurality of spacers on a fin template layer, in accordance with an embodiment of the present invention.

FIG. 4 is a cross-sectional side view of plurality of spacers on a fin template layer, in accordance with an embodiment of the present invention.

In one or more embodiments, the mandrel templates 141 and sacrificial mandrels 131 can be removed after the spacers are formed, where the mandrel templates 141 and sacrificial mandrels 131 can be removed by selective etching. The mandrel templates 141 and sacrificial mandrels 131 can be selectively removed, while the spacers 161 remain on the fin template layer 120 forming a fin pattern. The spacers 161 can be made of a different material from the mandrel templates 141 and sacrificial mandrels 131, so the mandrel templates 141 and sacrificial mandrels 131 can be selectively removed.

Figure 5:
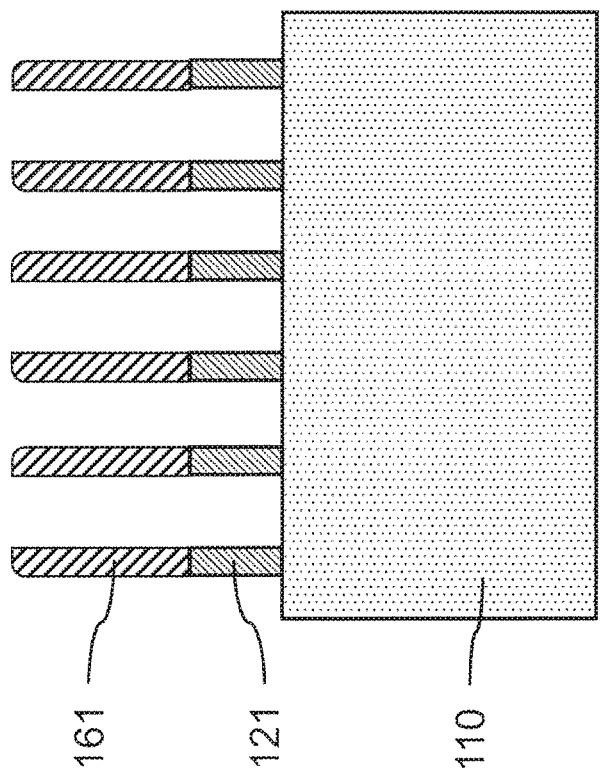
FIG. 5 is a cross-sectional side view of spacers on fin templates, in accordance with an embodiment of the present invention.

FIG. 5 is a cross-sectional side view of spacers on fin templates, in accordance with an embodiment of the present invention.

In one or more embodiments, the fin pattern formed by the spacers 161 can be transferred to the fin template layer 120 by removing the exposed portion of the fin template layer 120. In various embodiments, a portion of the fin template layer 120 can be removed to form a fin template 121 below each of the one or more spacers 161 by a directional RIE. Removal of the portions of the fin template layer 120 can expose portions of the underlying substrate 110, surface/active layer(s), or source/drain projection layer(s) between each of the spacer(s) 161 and fin template(s) 121.

Figure 6:
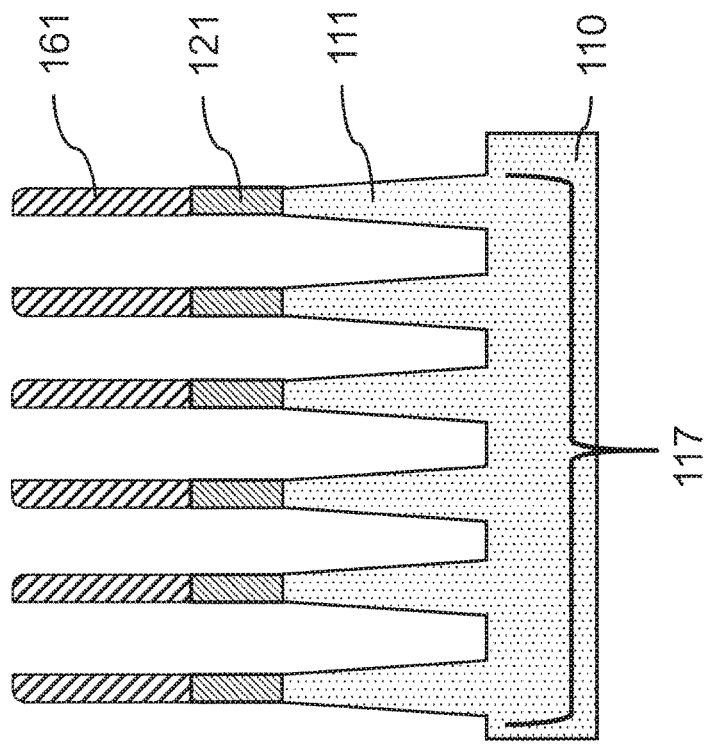
FIG. 6 is a cross-sectional side view of a spacer and fin template on each of a plurality of vertical fins formed from the substrate, in accordance with an embodiment of the present invention.

FIG. 6 is a cross-sectional side view of a spacer and fin template on each of a plurality of vertical fins formed from the substrate, in accordance with an embodiment of the present invention.

In one or more embodiments, the exposed portions of the substrate 110 (or active surface semiconductor layer) can be removed to form one or more vertical fin(s) 111, where the substrate 110 and one or more vertical fin(s) 111 can be made of a semiconductor material. In various embodiments, trenches can be etched into the substrate 110 between the spacer(s) 161 and fin template(s) 121 to leave free-standing vertical fin(s) 111, where the substrate can be etched by a directional RIE. The removal of the substrate material can form vertical fin(s) 111 with a tapered profile having a greater width at the base of the vertical fin(s) and a narrower width at the top of the fin(s), where the tapered profile can be produced as an aspect of the etching process. Alternatively, in various embodiments, the vertical fin(s) 111 can have a vertical profile with minimal or no tapering. A plurality of vertical fins 111 on the substrate can provide a set 117 of vertical fins 111 for forming a complementary metal oxide semiconductor (CMOS) device.

In non-limiting exemplary embodiments, the substrate 110 can be a single crystal silicon (Si) wafer or a single crystal silicon-germanium ($Si_xGe_y$) wafer, or the substrate can include a single crystal silicon (Si) or single crystal silicon-germanium active layer ($Si_xGe_y$) at the surface of the substrate 110 (i.e., surface/active layer) from which a plurality of vertical fins can be formed. In various embodiments, the germanium concentration of the silicon-germanium substrate or active layer can be in the range of about 10 at. % (i.e., atom percent) germanium to about 30% at. %, or about 15 at. % to about 25 at. %. In a non-limiting exemplary embodiment, the germanium concentration of the silicon-germanium source/drain projections can be about 20 at. %.

Figure 7:
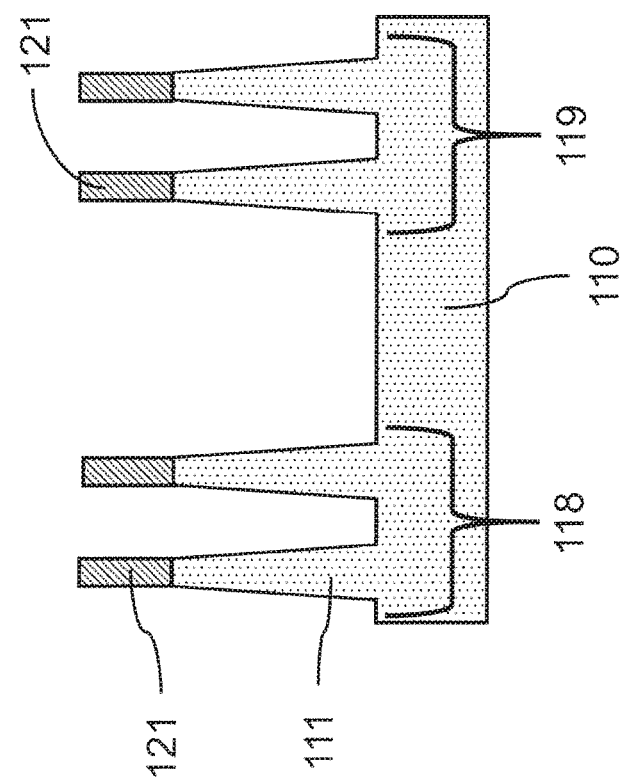
FIG. 7 is a cross-sectional side view of a plurality of vertical fins and fin templates on a region of the substrate after removal of one or more vertical fins, in accordance with an embodiment of the present invention.

FIG. 7 is a cross-sectional side view of a plurality of vertical fins and fin templates on a region of the substrate after removal of one or more vertical fins, in accordance with an embodiment of the present invention.

In one or more embodiments, the spacer(s) 161 can be removed from the top surface of the one or more fin template(s) 121. The spacer(s) 161 can be removed, for example, by an isotropic dry etch, a selective RIE process, or a selective wet etch. The underlying fin template(s) 121 can act as an etch stop. The fin template(s) 121 can remain on the vertical fin(s) 111 after the spacer(s) 161 are removed.

In one or more embodiments, one or more vertical fins 111 and fin templates 121 can be removed from the vertical fin pattern utilizing a fin-cut process, as known in the art, where removal of the one or more vertical fins provides intervening gaps between adjacent vertical fins to form, for example, shallow trench isolation regions and/or separate finFET devices that can be electrically coupled to form CMOS devices.

In various embodiments, a plurality of vertical fins formed on the substrate can be divided into two or more subsets 118, 119, where a first subset 118 of vertical fins includes one or more vertical fins and a second subset 119 of vertical fins includes one or more vertical fins of the plurality of vertical fins 111. In various embodiments, the plurality of vertical fins can be partitioned into four subsets arranged in a square or rectangular pattern on the substrate 110, where each of the subsets can be predetermined to form an n-type finFET or a p-type finFET (e.g., in a 2×2 arrangement). An n-type finFET and a p-type finFET in the arrangement can be electrically coupled to form a CMOS device. The intervening gaps and/or isolation regions can separate the finFETs and/or CMOS devices.

Figure 8:
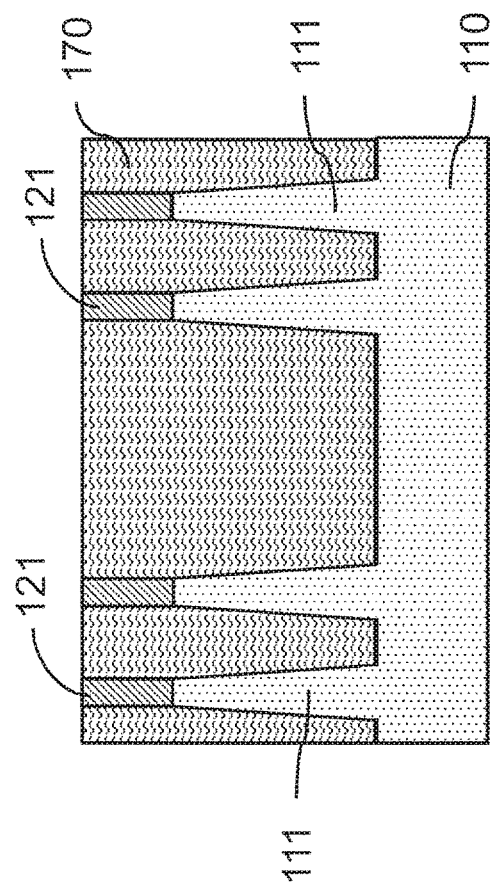
FIG. 8 is a cross-sectional side view of a filler layer on a plurality of vertical fins and fin templates, in accordance with an embodiment of the present invention.

FIG. 8 is a cross-sectional side view of a filler layer on a plurality of vertical fins and fin templates, in accordance with an embodiment of the present invention.

In one or more embodiments, a filler layer 170 can be formed on the plurality of vertical fins 111 and fin templates 121, where the filler layer can fill in the spaces between the vertical fins 111 and fin templates 121. The filler layer 170 can extend above the top surface of the fin templates 121, where the excess filler layer material can be etched back and/or removed by a chemical-mechanical polishing (CMP) to provide a smooth, uniform surface for subsequent processing.

In one or more embodiments, the filler layer 170 can be an amorphous silicon oxide (SiO) or low-k dielectric material. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

In various embodiments, the filler layer 170 can be blanket deposited on the vertical fins 111 and fin templates 121. In various embodiments, the filler layer 170 can be formed by CVD, LPCVD, or spun on.

Figures 9, 10:
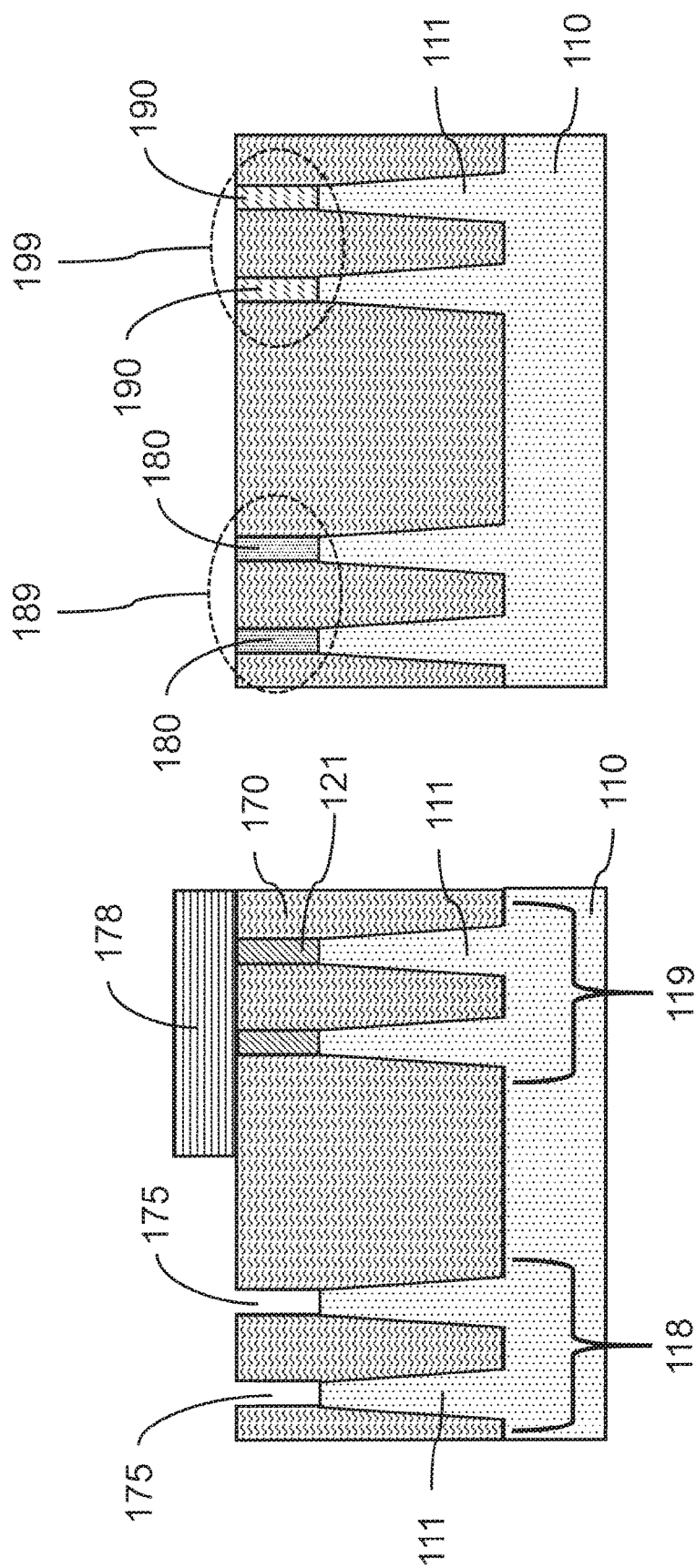
FIG. 9 is a cross-sectional side view of a masking layer on a portion of the filler layer and openings formed in the filler layer by removal of exposed fin templates, in accordance with an embodiment of the present invention.
FIG. 10 is a cross-sectional side view of source/drain projections formed in the openings of the filler layer, in accordance with an embodiment of the present invention.

FIG. 9 is a cross-sectional side view of a masking layer on a portion of the filler layer and openings formed in the filler layer by removal of exposed fin templates, in accordance with an embodiment of the present invention.

In one or more embodiments, a masking layer 178 can be formed on at least a portion of the filler layer 170, where the masking layer can cover one or more of the fin templates 121. The masking layer 178 can be located on at least a portion of the filler layer 170, where at least the top surface of one or more fin templates is exposed.

In one or more embodiments, the masking layer 178 can be an organic lithography material that can be patterned and developed. The masking layer 178 can be a positive or negative resist material, for example, Poly(methyl methacrylate) (PMMA) or SU-8, or an electron-beam cured material, for example, hydrogen silsesquioxane (HSQ).

In one or more embodiments, one or more exposed fin templates 121 can be removed from the tops of the vertical fins 111 to form an opening 175 in the filler layer 170 with the top surfaces of the vertical fins exposed. In various embodiments, the fin templates 121 can be removed by a selective etch, for example, a selective wet etch or dry plasma etch (e.g., RIE). In a non-limiting exemplary embodiment, the fin templates 121 can be silicon nitride (SiN), which can be selectively removed by a hot phosphoric acid etch.

In one or more embodiments, the vertical fins 111 can be a crystalline semiconductor with a predetermined crystal orientation, where removal of the one or more exposed fin templates 121 exposes a crystalline surface that can be used for epitaxial growth of a source/drain projection.

FIG. 10 is a cross-sectional side view of source/drain projections formed in the openings of the filler layer, in accordance with an embodiment of the present invention.

In various embodiments, a first source/drain projection 180 made of a first material can be formed on the exposed top surfaces of one or more vertical fin(s) 111, where the source/drain projections 180 on the one or more vertical fin(s) 111 forms a first set 189 of source/drain projections 180 on the first subset 118 of vertical fins. After formation of the first source/drain projection(s) 180 made of a first material, the first masking layer 178 can be removed to expose previously covered fin template(s) 121, and the first source/drain projection(s) 180 can be covered by a second masking layer.

In one or more embodiments, the one or more exposed fin templates 121 can be removed from the tops of the vertical fins 111 to form an opening in the filler layer 170 with the top surfaces of the vertical fins exposed. A second source/drain projection 190 made of a second material can be formed on the exposed top surfaces of one or more vertical fin(s) 111, where the source/drain projections 190 on the one or more vertical fin(s) 111 forms a second set 199 of source/drain projections 190 on the second subset 119 of vertical fins. In various embodiments, a second set 199 of source/drain projections 190 may be a different material from the material of the first set 189 of source/drain projections 180, where the material of the first set and second set of source/drain projections can be oxidizable and/or nitridable.

In one or more embodiments, source/drain projections 180, 190 can be formed in the opening(s) in the filler layer 170, where the source/drain projections 180, 190 can fill the opening(s) of the filler layer. The source/drain projections 180, 190 can be expitaxially grown on the fin surfaces.

In one or more embodiments, the source/drain projections 180, 190 can be an oxidizable material, including but not limited to silicon (Si) and silicon-germanium ($Si_xGe_y$). In various embodiments, the germanium concentration of the silicon-germanium source/drain projections can be in the range of about 30 at. % (i.e., atom percent) germanium to about 60% at. %, or about 40 at. % to about 50 at. %. In a non-limiting exemplary embodiment, the germanium concentration of the silicon-germanium source/drain projections can be about 40 at. %.

FIG. 11 is a cross-sectional side view of partially exposed source/drain projections, in accordance with an embodiment of the present invention.

In one or more embodiments, the height (i.e., thickness) of the filler layer 170 can be reduced to expose at least a portion of the source/drain projections 180, 190. The height (i.e., thickness) of the filler layer 170 can be reduced by selective direction etch, for example, a dry plasma etch (e.g. reactive ion etch (RIE)), that selectively removes exposed portions of the filler layer. In various embodiments, the dry plasma etch can be a timed etch that removes a predetermined amount of the upper portion of the filler layer.

In various embodiments, at least a portion of the source/drain projections 180, 190 remains below the surface level of the filler layer 170, where the lower portion of the source/drain projections remain covered by the filler layer. In various embodiments, the height of the surface of the filler layer 170 above the top surface of the vertical fins 111 can be in the range of about 10 nm to about 75 nm, or in the range of about 20 nm to about 60 nm, or in the range of about 35 nm to about 50 nm. The height of the source/drain projections 180, 190 remaining below the surface level of the filler layer 170 can be in the range of about 10 nm to about 75 nm, or in the range of about 20 nm to about 60 nm, or in the range of about 35 nm to about 50 nm, although other heights are contemplated.

FIG. 12 is a cross-sectional side view of the long axis of the vertical fins and source/drain projections in FIG. 11, further showing a dummy gate structure on the source/drain projections and an isolation region between the vertical fins, in accordance with an embodiment of the present invention.

In one or more embodiments, an isolation region 220 can be formed between two or more vertical fins 111, where the isolation region 220 can physically separate and electrically isolate two or more adjacent vertical fins 111. The isolation region can be formed by removing a portion of a vertical fin to form two separate vertical fins 111, where the vertical fin portion can be removed by masking, patterning, and etching, as would be known in the art. A portion of the substrate between the two separate fins can be at least partially removed to form an isolation trench between the vertical fins 111. The isolation trench can be at least partially filled with an insulating dielectric to form an isolation region 220 between two or more vertical fins 111, where the insulating dielectric can be silicon oxide (SiO), a low-k dielectric, a high-k dielectric, or combinations thereof.

In one or more embodiments, a dummy gate structure 210 can be formed on one or more of the vertical fins and/or source/drain projections 180, 190, where the dummy gate structure can include a dummy gate 212, a dummy gate template 215, and a dummy gate cap 217. The dummy gate structure can extend down the sides and between at least a portion of each vertical fin 111. The dummy gate structure 210 can be formed on the source/drain projections 180, 190 provided for forming an n-type finFET and a p-type finFET.

In one or more embodiments, the dummy gate 212 can be amorphous silicon (a-Si), polycrystalline silicon (p-Si), amorphous carbon (a-C), or a combination thereof.

In one or more embodiments, the dummy gate template 215 can be an oxide, for example, silicon oxide (SiO), a nitride, for example, silicon nitride (SiN), a silicon boronotride (SiBN), silicon borocarbonitride (SiBCN), or a combination thereof.

In one or more embodiments, the dummy gate cap 217 can be an oxide, for example, silicon oxide (SiO), a nitride, for example, silicon nitride (SiN), a silicon boronotride (SiBN), silicon borocarbonitride (SiBCN), or a combination thereof, where the material of the dummy gate cap 217 is different from the material of the dummy gate template 215.

In various embodiments, the dummy gate structure 210 and isolation region 220 can be formed prior to formation of a protective layer on the source/drain projections.

FIG. 13 is a cross-sectional side view of a protective layer covering portions of the source/drain projections exposed by reducing the height of the filler layer, in accordance with an embodiment of the present invention.

In one or more embodiments, the exposed portions of one or more source/drain projections 180, 190 can be covered by a protective layer 200, where the protective layer 200 can be blanket deposited on at least a portion of the exposed surface of the filler layer 170. The protective layer 200 can protect a dummy gate structure during processing of the source/drain projections 180, 190. In various embodiments, the protective layer 200 can be formed by ALD, CVD, PVD, or a combination thereof.

In one or more embodiments, the protective layer can be an oxide, for example, silicon oxide (SiO), a nitride, for example, silicon nitride (SiN), a silicon boronotride (SiBN), silicon borocarbonitride (SiBCN), a low-k material, or a combination thereof. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

FIG. 14 is a cross-sectional side view of the long axis of the vertical fins in FIG. 13, further showing a dummy gate structure and isolation region covered by the protective layer, in accordance with an embodiment of the present invention.

In one or more embodiments, the protective layer 200 can be formed on the top surface and sidewalls of the dummy gate structure 210, where the protective layer 200 covers the dummy gate structure 210 to avoid oxidation of at least the dummy gate 212.

FIG. 15 is a cross-sectional side view of partially exposed source/drain projections and filler layer, in accordance with an embodiment of the present invention.

In one or more embodiments, at least a portion of the protective layer 200 on the source/drain projections 180, 190 can be removed and a portion of the protective layer 200 on the dummy gate structure 210 etched back to expose the source/drain projections 180, 190 and a portion of the dummy gate cap 217. In various embodiments, all of the protective layer 200 can be removed from the source/drain projections 180, 190, where an upper portion of the source/drain projections 180, 190 above the top surface of the filler layer can thereby be exposed. The protective layer 200 can be etched back using a directional RIE, so portions of the protective layer 200 remain on the sidewalls of the dummy gate structure.

FIG. 16 is a cross-sectional side view of the long axis of the vertical fins and source/drain projections in FIG. 15 showing exposed source/drain projections and a partially covered dummy gate structure on the source/drain projections, in accordance with an embodiment of the present invention.

In one or more embodiments, at least a portion of the protective layer 200 remains on the sidewalls and endwalls of the dummy gate structure 210 forming one or more protective layer spacers 205, whereas portions of the source/drain projections 180, 190 on either side of the dummy gate structure and isolation region 220 can be exposed.

FIG. 17 is a cross-sectional side view of a first set of source/drain projections partially converted to an amorphous material casing and a second set of source/drain projections partially converted to an amorphous material, in accordance with an embodiment of the present invention.

In one or more embodiments, the source/drain projections 180, 190 can be at least partially converted to a casing 235, where the casing 235 can be an amorphous material. The amorphous material can be an oxide (e.g., SiO) or a nitride (e.g., SiN). In various embodiments, the source/drain projections 180, 190 can be converted to an oxide by exposure to an oxidizing atmosphere, for example, a wet oxidation. In various embodiments, the source/drain projections 180, 190 can be converted to a nitride by exposure to an nitriding atmosphere, for example, an ammonia ($NH_3$) atmosphere. The casing 235 can be a temporary casing that can be selectively removed.

In one or more embodiments, an external portion of source/drain projections 180 exposed above the filler layer surface can be converted to an amorphous material, while an internal portion of the source/drain projections 180 and portion below the filler layer surface can remain unconverted material. In various embodiments, the portion of the source/drain projections 190 exposed above the filler layer surface can be converted to an amorphous material, while the portion below the filler layer surface can remain unconverted material.

In various embodiments, the material of a second set 199 of source/drain projections 190 can have a higher reaction rate for oxidation or nitridation than the material of a first set 189 of source/drain projections 180. In various embodiments, the entire portion of a source/drain projection 190 exposed above the surface of the filler layer 170 can be converted to an amorphous material, whereas only a portion of a source/drain projection 180 exposed above the surface of the filler layer can be converted to an amorphous material during the same reaction period. The first set 189 of source/drain projections 180 and second set 199 of source/drain projections 190 may be converted at the same time, such that the duration of the conversion process can be controlled to provide a predetermined amount of reaction between the oxidizing or nitriding reactants and source/drain projections 180, 190 to form a casing 235 having a predetermined thickness.

In one or more embodiments, a first set 189 of source/drain projections 180 can be partially converted to the amorphous material above the surface of the filler layer 170, while a second set 199 of source/drain projections 190 can be completely converted to an amorphous material above the surface of the filler layer.

In various embodiments, a portion of a source/drain projection 180 exposed above the surface of the filler layer 170 can be converted to an amorphous material to provide a source/drain seed mandrel 185 for epitaxial growth of a first source/drain. A portion of the source/drain projection 180 can remain below the surface level of the filler layer 170 as a source/drain base 181 for the source/drain seed mandrel 185. The source/drain projection 180 can be partially converted leaving a central portion as the source/drain seed mandrel 185 surrounded by the amorphous material casing 235.

In various embodiments, all of the source/drain projection 190 exposed above the surface of the filler layer 170 can be converted to an amorphous material to provide a dummy source/drain mandrel 230, where the amorphous material of the dummy source/drain mandrel 230 may not be conducive to epitaxial growth of a source/drain. A portion of the source/drain projection 190 can remain below the surface level of the filler layer 170 as a source/drain base 191 for the dummy source/drain mandrel 230.

In a non-limiting exemplary embodiment, the first set 189 of source/drain bases 181 can be single crystal silicon, and the second set 199 of source/drain bases 191 can be single crystal silicon-germanium.

FIG. 18 is a cross-sectional side view of the long axis of the vertical fins and converted source/drain projections in FIG. 17 showing a source/drain seed mandrel and dummy source/drain mandrel, in accordance with an embodiment of the present invention.

In one or more embodiments, the surface portion of the source/drain projection 180 can be converted to an amorphous material casing 235 covering the source/drain seed mandrel 185, where the material of the source/drain projection 180 covered by the dummy gate structure may not be converted to the casing 235. The source/drain projection 180 can remain below the dummy gate 212 of the dummy gate structure.

In various embodiments, a portion of the source/drain projection 190 can remain below the dummy gate 212 of the dummy gate structure.

In a non-limiting exemplary embodiment, the exposed dummy gate cap 217 can be an oxide material, for example, silicon oxide (SiO), that can resist further oxidation during conversion of the source/drain projections 180 to casing 235 and source/drain seed mandrel 185, and source/drain projections 190 to dummy source/drain mandrel 230.

FIG. 19 is a cross-sectional side view of source/drain seed mandrel after removal of the casing, and partially removed dummy source/drain mandrels, in accordance with an embodiment of the present invention.

In one or more embodiments, the casing 235 formed on the source/drain seed mandrels 185 can be selectively removed to expose the underlying crystalline material of the source/drain seed mandrels 185. An outer thickness of the dummy source/drain mandrels 230 can be removed at the same time that the casing 235 is removed from the source/drain seed mandrels 185, where the thickness of material removed from the dummy source/drain mandrels 230 can be the same as the thickness of the casing 235. A selective isotropic etch, for example, a selective wet isotropic etch or an isotropic plasma process, can be utilized to remove equal thickness of an amorphous material from the dummy source/drain mandrels 230 and source/drain seed mandrels 185. The etching can be a timed etch to control the thickness of material removed from the dummy source/drain mandrels 230, whereas the source/drain seed mandrels 185 can act as an etch stop for removing the casing 235. In various embodiments, the etching process can be an isotropic wet etch or an isotropic plasma etch.

In various embodiments, an outer portion of the dummy source/drain mandrels 230 can be removed leaving a dummy post 237 extending from a source/drain base 191, where the portion of the converted oxide portion of the second set of source/drain projections can be removed to form the dummy post 237. The dummy post can be an amorphous material, for example, SiO or SiN.

FIG. 20 is a cross-sectional side view of the long axis of the source/drain seed mandrel and dummy post in FIG. 19 after removal of the casing, in accordance with an embodiment of the present invention.

In one or more embodiments, removal of the casing 235 and the outer portion of the dummy source/drain mandrel 230 can leave the source/drain seed mandrels 185 and dummy post 237. The dummy gate structures 210 can remain on the unreacted portions of the source/drain projections 180 and the source/drain projections 190.

FIG. 21 is a cross-sectional side view of a source/drain base after removal of the source/drain seed mandrel, and partial removal of the dummy source/drain mandrels, in accordance with an embodiment of the present invention.

In one or more embodiments, the source/drain seed mandrels 185 can be removed leaving an exposed source/drain base 181. The source/drain seed mandrels 185 can be selectively removed, while the dummy posts 237 remain on the source/drain base 191. The exposed source/drain base 181 can be crystalline with a predetermined crystal orientation, where a source/drain can be epitaxially gown on the exposed surface of the source/drain base 191. In various embodiments, the source/drain seed mandrels 185 and the source/drain base 181 can be removed and the source/drain can be epitaxially gown on the exposed surface of the vertical fins 111.

FIG. 22 is a cross-sectional side view of the long axis of the vertical fins and dummy gate structures in FIG. 21 after removal of the source/drain seed mandrel, in accordance with an embodiment of the present invention.

In one or more embodiments, removal of a portion of the source/drain seed mandrels 185 can reduce the height of at least a portion of the source/drain seed mandrels 185 not covered by the dummy gate structure 210, and expose at least a portion of source/drain base 181. In various embodiments, the height of the source/drain seed mandrels 185 can be reduced to the top surface 225 of the isolation region 220.

FIG. 23 is a cross-sectional side view of a source/drain formed on the source/drain bases, and partially removed dummy source/drain mandrels, in accordance with an embodiment of the present invention.

In one or more embodiments, source/drains 240 can be formed on the source/drain base 181 on the first subset 118 of vertical fins 111. In various embodiments, the source/drains 240 can be n-type source/drains or p-type source/drains.

In one or more embodiments, the source/drains 240 can overlap 242 to form merged source/drains on the first subset 118 of vertical fins 111. In various embodiments, the source/drains 240 can be epitaxially grown on the source/drain bases 181 until the material of the source/drains 240 merge into a single source/drain coupled to a plurality of vertical fins 111.

FIG. 24 is a cross-sectional side view of the long axis of the vertical fins and dummy gate structures in FIG. 23 after formation of the source/drains, in accordance with an embodiment of the present invention.

In one or more embodiments, source/drains 240 can be formed on the source/drain base 181 on either side of the dummy gate structure 210 and remaining portion of the source/drain projection(s) 180. The remaining portion of the source/drain projection 180 can be between the source/drains 240 and below the dummy gate structure 210. The material of the source/drain projections 180 under the dummy gate structure/spacer can remain unoxidized or unnitrided, and can form a channel region for a finFET device.

Figures 25, 26:
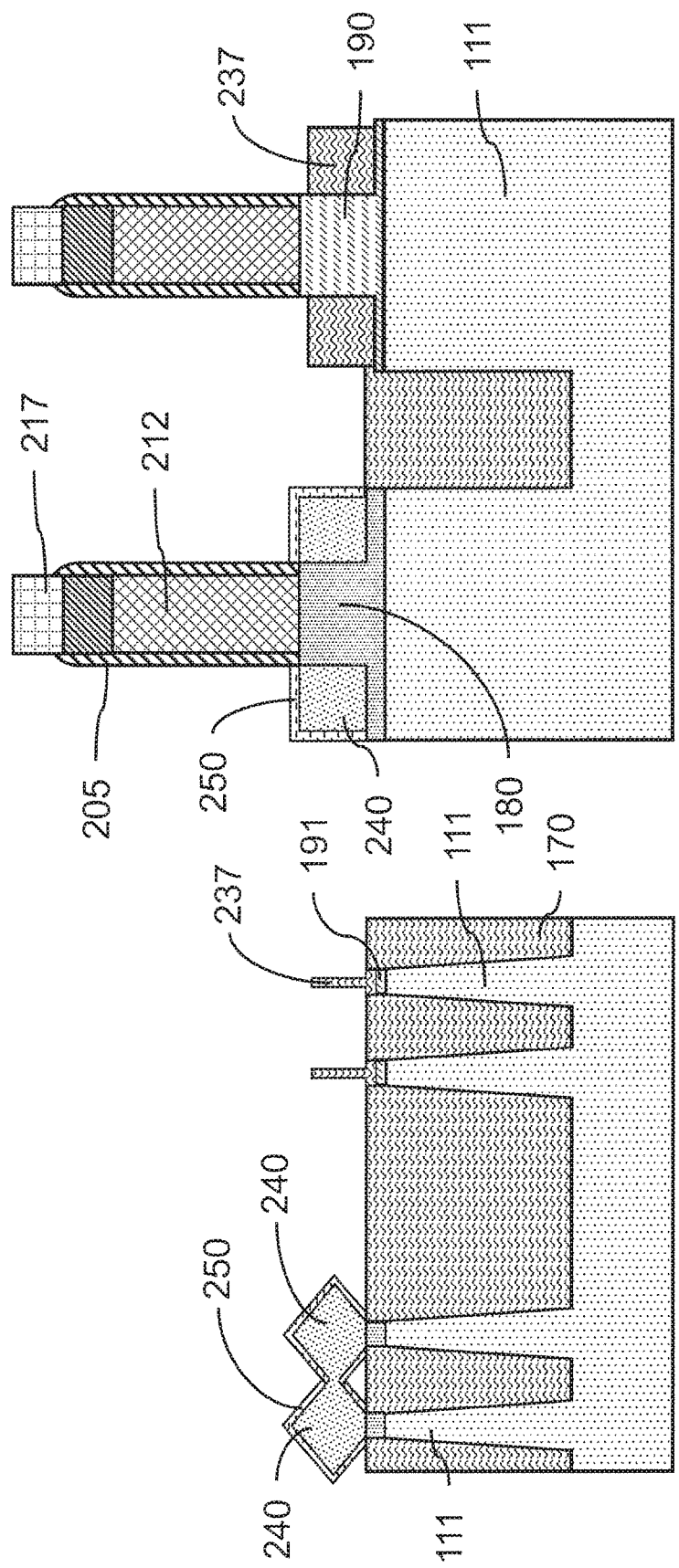
FIG. 25 is a cross-sectional side view of a liner formed on the source/drains, in accordance with an embodiment of the present invention.
FIG. 26 is a cross-sectional side view of the long axis of the vertical fins and dummy gate structures in FIG. 25 after formation of a liner on the source/drains, in accordance with an embodiment of the present invention.

FIG. 25 is a cross-sectional side view of a liner formed on the source/drains, in accordance with an embodiment of the present invention.

In one or more embodiments, a liner 250 can be formed on the source/drains 240, where the liner 250 can protect the source/drains 240 during removal of the dummy posts 237. In various embodiments, the liner 250 can be an oxide or nitride that is different from the material of the dummy posts 237, such that the dummy posts 237 can be selectively removed without removing the source/drain(s) 240, and can prevent additional epitaxial growth on the source/drains 240. The liner 250 can be an oxide (e.g., SiO) or a nitride (e.g., SiN), such that the dummy posts 237 can be selectively removed in relation to the liner 250 and source/drain base 191.

FIG. 26 is a cross-sectional side view of the long axis of the vertical fins and dummy gate structures in FIG. 25 after formation of a liner on the source/drains, in accordance with an embodiment of the present invention.

In one or more embodiments, a liner 250 can be formed on the source/drains 240 on opposite sides of the dummy gate structure 210. The liner 250 can be formed by oxidizing or nitriding an outer layer of the exposed material of the source/drains 240.

FIG. 27 is a cross-sectional side view of the source/drains on the first subset of vertical fins after removal of the dummy posts from the second subset of vertical fins, in accordance with an embodiment of the present invention.

In one or more embodiments, the dummy posts 237 can be removed from the source/drain base 191 on one or more vertical fins(s) 111, where the dummy posts 237 can be removed by a selective etch, for example, RIE or a wet etch, where the etching can be selective relative to the material of the isolation region 220 and source/drain bases 191. The source/drain base(s) 191 can be exposed for formation of source/drains 260 on the second subset 119 of vertical fins 111. In various embodiments, the source/drains 260 can be n-type source/drains or p-type source/drains.

FIG. 28 is a cross-sectional side view of the long axis of the vertical fins and dummy gate structures in FIG. 27 after removal of the dummy posts, in accordance with an embodiment of the present invention.

In one or more embodiments, the dummy posts 237 can be removed to expose the underlying source/drain base(s) 191 on either side of the dummy gate structure for subsequent formation of source/drains, where the source/drain can be epitaxially gown. In various embodiments, the source/drain base(s) 191 can be removed and the source/drain can be epitaxially gown on the exposed surface of the vertical fins 111.

Figures 29, 30:
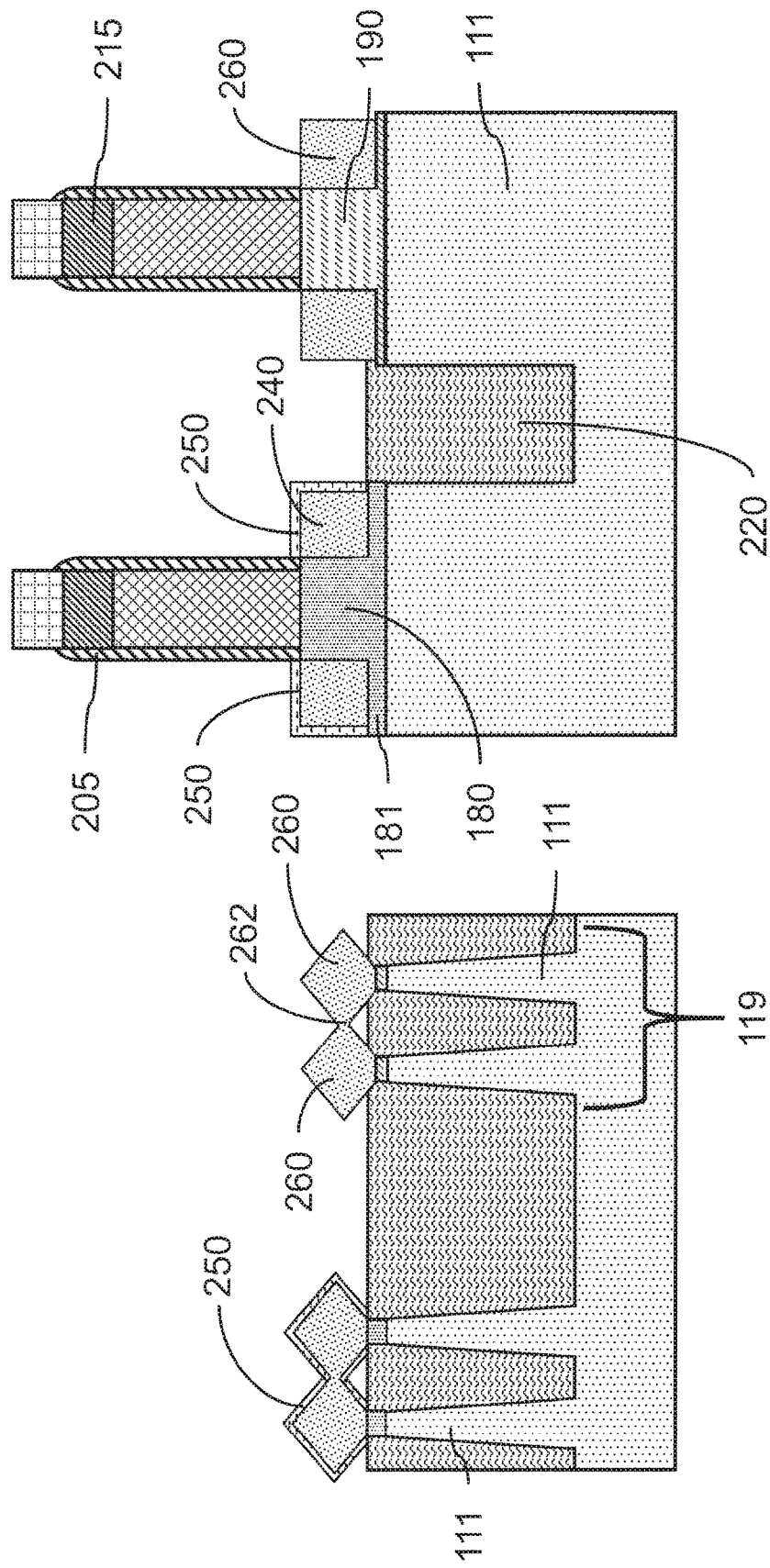
FIG. 29 is a cross-sectional side view of a source/drain formed on the source/drain bases, in accordance with an embodiment of the present invention.
FIG. 30 is a cross-sectional side view of the long axis of the vertical fins and dummy gate structures in FIG. 29 after formation of the source/drains, in accordance with an embodiment of the present invention.

FIG. 29 is a cross-sectional side view of a source/drain formed on the source/drain bases, in accordance with an embodiment of the present invention.

In one or more embodiments, source/drains 260 can be formed on the source/drain base 191 on the second subset 119 of vertical fins 111. In various embodiments, the source/drains 260 can be n-type source/drains or p-type source/drains.

In one or more embodiments, the source/drains 260 can overlap 262 to form merged source/drains on the second subset 119 of vertical fins 111.

FIG. 30 is a cross-sectional side view of the long axis of the vertical fins and dummy gate structures in FIG. 29 after formation of the source/drains, in accordance with an embodiment of the present invention.

In one or more embodiments, source/drains 260 can be formed (e.g., by epitaxy) on the source/drain base 191 on either side of the dummy gate structure 210. A portion of the source/drain projection 190 can be between the source/drains 260 and below the dummy gate structure 210, and can form a channel region for a finFET device. The channel region can remain the same material originally formed as the source/drain projections 190 and/or vertical fin(s) 111.

FIG. 31 is a cross-sectional side view of source/drains formed on the first subset of vertical fins and second subset of vertical fins after removal of the liner, in accordance with an embodiment of the present invention.

In various embodiments, the liner 250 can be removed from source/drains 240, where the liner can be removed by a selective etch.

FIG. 32 is a cross-sectional side view of the long axis of the vertical fins and dummy gate structures in FIG. 31 after removal of the liner, in accordance with an embodiment of the present invention.

Figures 33, 34:
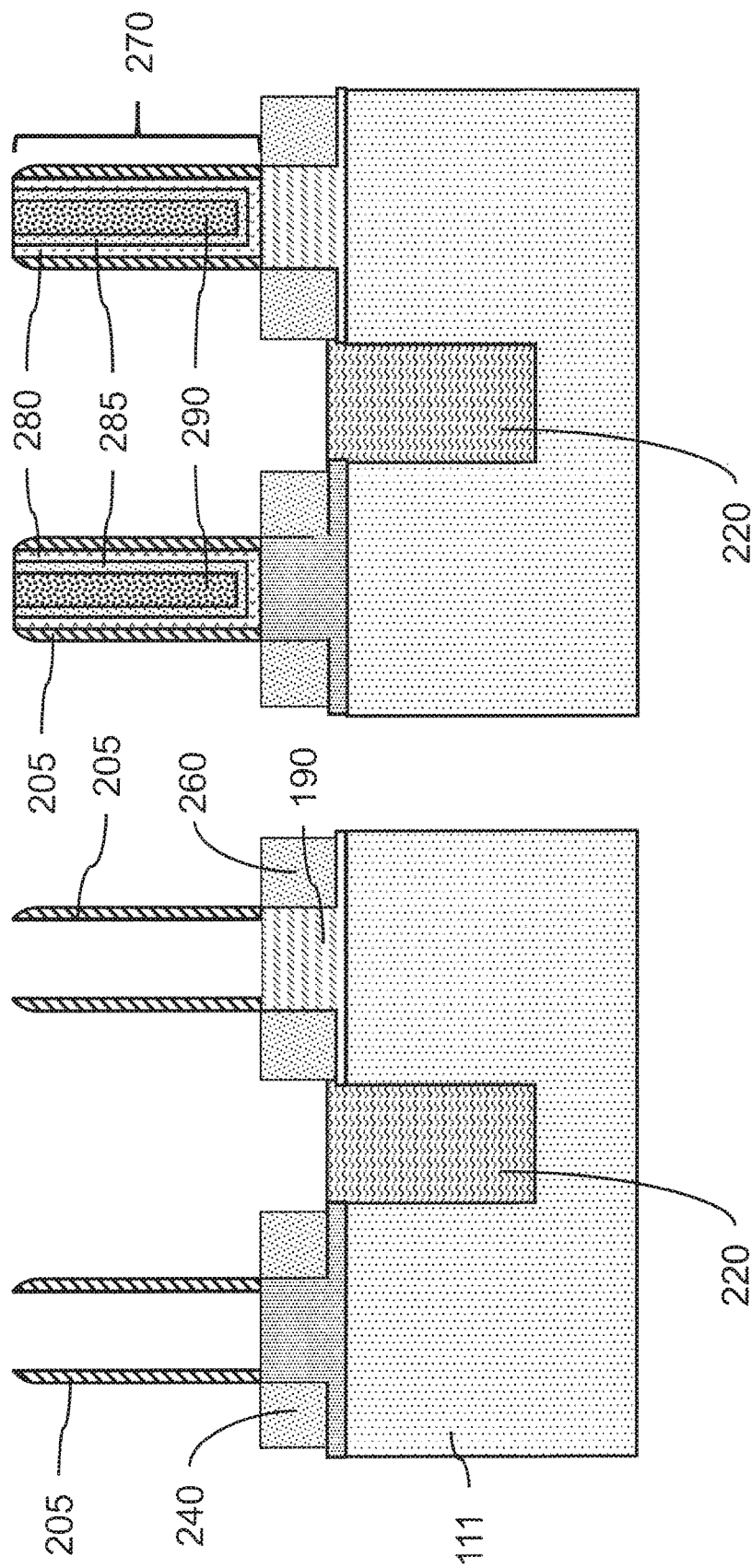
FIG. 33 is a cross-sectional side view of the long axis of the vertical fins and upright spacers on the vertical fins after removal of the dummy gate structures, in accordance with an embodiment of the present invention.
FIG. 34 is a cross-sectional side view of the long axis of the vertical fins and gate structures, in accordance with an embodiment of the present invention.

FIG. 33 is a cross-sectional side view of the long axis of the vertical fins and upright spacers on the vertical fins after removal of the dummy gate structure, in accordance with an embodiment of the present invention.

In one or more embodiments, the dummy gate cap 217, dummy gate template 215, and dummy gate 212, can be removed from between the spacers 205 to expose the underlying source/drain base(s) 181, and vertical fin(s) 111. The components 212, 215, 217 of the dummy gate structure 210 can be removed by selective etching, for example, RIE, to expose a remaining portion of the source/drain projections 180, 190 between the protective layer spacers 205, while leaving the source/drains 240, 260 and protective spacers 205.

FIG. 34 is a cross-sectional side view of the long axis of the vertical fins and gate structures, in accordance with an embodiment of the present invention.

In one or more embodiments, a gate structure 270 can be formed between the protective spacers 205, where the gate structure can include a gate dielectric layer 280 and a gate electrode. The gate dielectric layer 280 can be formed on at least a portion of the protective spacers 205 and source/drain projections 180, 190. A work function layer 285 can be formed on the gate dielectric layer 280.

In one or more embodiments, the gate dielectric layer 280 can be an insulating dielectric layer, for example, a silicon oxide (SiO) or a high-K dielectric.

In various embodiments, the dielectric layer 280 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., BaTiO$_3$—SrTiO$_3$), barium titanium oxide (e.g., BaTiO$_3$), strontium titanium oxide (e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$Nb$_{2/3}$O$_3$). The high-k material can further include dopants such as lanthanum and/or aluminum. The stoichiometry of the high-K compounds can vary.

In one or more embodiments, the gate dielectric layer 280 can be formed by a conformal deposition, for example, ALD, PEALD, CVD, PECVD, or combinations thereof.

In one or more embodiments, a work function layer 285 can be formed on the gate dielectric layer 280. A work function layer 285 can be formed on the exposed portion(s) of the gate dielectric layer 280 between protective spacers 205. The work function layer 285 can be formed on the gate dielectric layer 280 to adjust the electrical properties of the gate electrode. In various embodiments, the work function layer 285 can be optional. A cover layer can be formed on the source/drains 240, 260, isolation region 220, and other exposed components prior to forming a gate structure to protect the components during formation and etching of the layers 280, 285, 290, and the cover layer subsequently removed, as would be known in the art.

In various embodiments, a work function layer 285 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 285 can include multiple layers of work function materials, for example, a work function layer 285 can be a TiN/TiC stack.

In one or more embodiments, the work function layer 285 can be formed by a conformal deposition, for example, ALD, PEALD, CVD, PECVD, or combinations thereof. The work function layer 285 can be formed by a directional ion deposisition, for example, PVD or a gas cluster ion beam deposition (GCIB), where the work function layer 285 can be formed on the exposed surfaces of the gate dielectric layer 280 on the vertical fin(s) 111, but not deposited on the vertical sidewalls of the protective spacer 205. Portions of the work function layer 285 can be removed from the sidewalls of the protective spacer 205 by a non-directional etch. The work function layer 285 can be at least partially etched back.

In various embodiments, the work function layer 285 can have a thickness in the range of about 3 nm to about 11 nm, or can have a thickness in the range of about 5 nm to about 8 nm.

In one or more embodiments, a gate fill layer 290 can be formed on the gate dielectric layer 280 and/or work function layer 285 if present, where the gate fill layer 290 can fill in the space(s) between the gate dielectric layer 280 or work function layer 285. The gate fill layer 290, gate dielectric layer 280, and optionally the work function layer 285, can form a gate structure 270 on one or more vertical fin(s) 111, where the gate fill layer 290 and work function layer 285 can form a conductive gate electrode.

In various embodiments, the gate fill layer 290 can be blanket deposited on the exposed surfaces of the gate dielectric layer 280 and/or work function layer 285 on the vertical fin(s) 111. The formed gate fill layer 290 can extend above the top surface of the protective spacers 205, where the gate fill layer material above the top surfaces can be removed by a CMP to provide a flat, uniform surface.

In various embodiments, the gate fill layer 290 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In one or more embodiments, an interlayer dielectric (ILD) can be formed on the gate structure(s) 270, filler layer 170, and vertical fin(s) 111, where the ILD can be formed after removal of the cover layer. In one or more embodiments, an interlayer dielectric can be a silicon oxide (SiO) or a low-k dielectric material. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

In various embodiments, the interlayer dielectric can be blanket deposited on the filler layer 170, vertical fin(s) 111, and gate structure(s) 270. In various embodiments, the interlayer dielectric 310 can be formed by CVD, LPCVD, or spun on. Electrical contacts can be made through the ILD to the source/drains 240, 260 and gate structures 270.

In one or more embodiments, an isolation region 220 separates the two rows of vertical fins, where the vertical fins can be part of a p-type finFET or an n-type finFET. The NFET and PFET can be electrically coupled to form a CMOS device.

FIGS. 35-40 depict an alternative approach to forming the source/drain projections shown in FIG. 1-11. FIG. 40 shows the resulting arrangement of source/drain projections shown in FIG. 11, after which the process shown in FIG. 12-34 can be performed to form the structures, as described herein.

FIG. 35 is a cross-sectional side view of a first source/drain projection layer and a second source/drain projection layer on the substrate, and a fin template layer on the first source/drain projection layer and a second source/drain projection layer, in accordance with an embodiment of the present invention.

In one or more embodiments, material layers intended to form active vertical fins 111 and/or one or more source/drain projections 180, 190 can be formed on the substrate surface before formation of a fin template layer 120. In one or more embodiments, a first source/drain projection layer 114 can be formed on the substrate 110, where the first source/drain projection layer 114 can be epitaxially grown on at least a portion of the surface of the substrate 110. Predetermined areas of the first source/drain projection layer 114 can be masked and etched to remove portions of the first source/drain projection layer 114 and expose the underlying substrate 110. The masking and patterning can include formation of a hardmask and/or a softmask. A second source/drain projection layer 116 can be formed on the exposed areas of the substrate, where the second source/drain projection layer can be epitaxially grown on the exposed surface(s) of the substrate 110. A chemical-mechanical polishing (CMP) can be used to provide a smooth, flat surface for subsequent processing.

In one or more embodiments, the source/drain projection layers 114, 116 can be an oxidizable material, including but not limited to silicon (Si) and silicon-germanium (Si$_x$Ge$_y$). In various embodiments, the germanium concentration of the silicon-germanium source/drain projection layer can be in the range of about 30 at. % (i.e., atom percent) germanium to about 60% at. %, or about 40 at. % to about 50 at. %. In a non-limiting exemplary embodiment, the germanium concentration of the silicon-germanium source/drain projection layer can be about 40 at. %.

In one or more embodiments, a fin template layer 120, mandrel layer 130, mandrel template layer 140, and mandrel mask layer 150, can be formed on the first source/drain projection layer 114 and second source/drain projection layer 116, as described for FIG. 1.

FIG. 36 is a cross-sectional side view of a mandrel mask segment and mandrel template on each of a plurality of sacrificial mandrels on a fin template layer, in accordance with an embodiment of the present invention.

In one or more embodiments, a fin template layer 120, mandrel layer 130, mandrel template layer 140, and mandrel mask layer 150, can be formed and patterned as described herein for FIGS. 2-3. The mandrel mask segments 151 and mandrel templates 141 can be patterned on the mandrel layer 130, and sacrificial mandrels 131 formed on the fin template layer 120.

FIG. 37 is a cross-sectional side view of a spacer and fin template on a first source/drain projection layer and a second source/drain projection layer, in accordance with an embodiment of the present invention.

In one or more embodiments, spacers 161 can be formed on the sacrificial mandrels 131, and the spacer pattern transferred to the fin template layer 130, as described herein, to form one or more fin template(s) 121 on each of the first source/drain projection layer 114 and second source/drain projection layer 116.

FIG. 38 is a cross-sectional side view of a spacer, fin template, and source/drain projection on each of a plurality of vertical fins formed from the substrate, in accordance with an embodiment of the present invention.

In one or more embodiments, the spacer 161 and fin template 121 pattern can be transferred to the first source/drain projection layer 114 and/or second source/drain projection layer 116 by removing the exposed material between the spacers 161 and fin templates 121. The exposed portions of the first source/drain projection layer 114 and second source/drain projection layer 116 can be removed by a directional etch (e.g., RIE) to form one or more first source/drain projection(s) 180, and/or one or more second source/drain projection(s) 190 on the substrate 110 or active surface semiconductor layer. Removal of portions of the first source/drain projection layer 114 and second source/drain projection layer 116 can expose underlying portions of the substrate 110.

In one or more embodiments, the exposed portions of the substrate 110 (or active surface semiconductor layer) can be removed to form one or more vertical fin(s) 111, where the substrate 110 (or active surface semiconductor layer), and one or more vertical fin(s) 111 can be made of a semiconductor material. In various embodiments, trenches can be etched into the substrate 110 between the spacer(s) 161, fin template(s) 121, and source/drain projection(s) 180, 190 to leave free-standing vertical fin(s) 111, where the substrate can be etched by a directional RIE. The removal of the substrate material can form vertical fin(s) 111 with a tapered profile having a greater width at the base of the vertical fin(s) and a narrower width at the top of the fin(s), where the tapered profile can be produced as an aspect of the etching process. Alternatively, in various embodiments, the vertical fin(s) 111 can have a vertical profile with minimal or no tapering. A plurality of source/drain projection(s) 180, 190 and vertical fins 111 on the substrate can provide a set 117 of vertical fins 111 for forming a complementary metal-oxide-semiconductor (CMOS) device.

FIG. 39 is a cross-sectional side view of a fin template and source/drain projection on each of a plurality of vertical fins formed from the substrate, in accordance with an embodiment of the present invention.

In one or more embodiments, the spacer(s) 161 can be removed from the top surface of the one or more fin templates 121. The spacer(s) 161 can be removed, for example, by an isotropic dry etch, a selective RIE process, or a selective wet etch. The fin template(s) 121 can remain on the source/drain projection(s) 180, 190 after the spacer(s) 161 are removed, or can be subsequently removed by a selective etch.

In one or more embodiments, one or more vertical fins 111, source/drain projection(s) 180, 190, and fin templates 121 can be removed from the vertical fin pattern utilizing a fin-cut process, as known in the art, where removal of the one or more vertical fins provides intervening gaps between adjacent vertical fins to form, for example, shallow trench isolation regions and/or separate finFET devices that can be electrically coupled to form CMOS devices.

In various embodiments, a plurality of vertical fins formed on the substrate can be divided into two or more subsets 118, 119, where a first subset 118 of vertical fins includes one or more vertical fins with source/drain projection(s) 180, and a second subset 119 of vertical fins includes one or more vertical fins with source/drain projection(s) 190. In various embodiments, the plurality of vertical fins 111 can be partitioned into four subsets arranged in a square or rectangular pattern on the substrate 110, where each of the subsets can be predetermined to form an n-type finFET or a p-type finFET (e.g., in a 2×2 arrangement). An n-type finFET and a p-type finFET in the arrangement can be electrically coupled to form a CMOS device. The intervening gaps and/or isolation regions can separate the finFETs and/or CMOS devices.

FIG. 40 is a cross-sectional side view of partially exposed source/drain projections on vertical fins, in accordance with an embodiment of the present invention.

In one or more embodiments, a filler layer 170 can be formed on the vertical fins 111 and source/drain projection(s) 180, 190, and the height of the filler layer reduced, as described herein for FIGS. 8-11. The fin templates 121 can be removed prior to or after formation of the filler layer. In various embodiments, at least a portion of the source/drain projections 180, 190 remains below the surface level of the filler layer 170, where the lower portion of the source/drain projections remain covered by the filler layer. In various embodiments, the height of the surface of the filler layer 170 above the top surface of the vertical fins 111 can be in the range of about 10 nm to about 75 nm, or in the range of about 20 nm to about 60 nm, or in the range of about 35 nm to about 50 nm. The height of the source/drain projections 180, 190 remaining below the surface level of the filler layer 170 can be in the range of about 10 nm to about 75 nm, or in the range of about 20 nm to about 60 nm, or in the range of about 35 nm to about 50 nm, although other heights are also contemplated.

In various embodiments, after formation of the vertical fins 111, source/drain projections 180, 190, and filler layer, as depicted in FIG. 40, the process can continue as shown in FIGS. 12-35 and described in the accompanying paragraphs herein.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A complementary metal oxide semiconductor (CMOS) device, comprising:
 an arrangement of a plurality of vertical fins on a substrate, wherein the plurality of vertical fins are made of a semiconductor material;
 a first set of source/drain bases directly in contact with a first subset of vertical fins, wherein the first set of source/drain bases includes silicon (Si);
 a second set of source/drain bases directly in contact with a second subset of vertical fins, wherein the second set of source/drain bases includes silicon germanium (SiGe);
 an isolation region in the substrate between the first subset of vertical fins and the second subset of vertical fins;
 a first source/drain projection on each of the first set of source/drain bases;

a second source/drain projection on each of the second set of source/drain bases;

n-type source/drains on each of the first set of source/drain bases; and p-type source/drains on each of the second set of source/drain bases.

2. The complementary metal oxide semiconductor (CMOS) device of claim 1, wherein the substrate is silicon-germanium, and the germanium concentration of the silicon-germanium substrate is in the range of about 10 at.% germanium to about 30% at.% germanium, and wherein the second set of source/drain bases has a germanium concentration in the range of about 30 at.% Ge to about 60 at.% Ge.

3. The complementary metal oxide semiconductor (CMOS) device of claim 1, wherein the first set of source/drain bases is single crystal silicon, and the second set of source/drain bases is single crystal silicon-germanium.

4. The complementary metal oxide semiconductor (CMOS) device of claim 1, wherein the arrangement of a plurality of vertical fins on the substrate is an array of two rows and at least two columns.

5. The complementary metal oxide semiconductor (CMOS) device of claim 4, wherein the isolation region separates the two rows of vertical fins, wherein the first subset of vertical fins is on one side of the isolation region and the second subset of vertical fins is on the opposite side of the isolation region from the first subset.

6. The complementary metal oxide semiconductor (CMOS) device of claim 1, wherein the source/drains on the first set of source/drain bases are merged source/drains.

7. The complementary metal oxide semiconductor (CMOS) device of claim 6, wherein the source/drains on the second set of source/drain bases are merged source/drains.

8. The complementary metal oxide semiconductor (CMOS) device of claim 7, further comprising a first gate structure on at least a portion of each of the first subset of vertical fins wherein the gate structure includes a gate dielectric layer on a portion of a source/drain projection that forms a channel region.

9. A complementary metal oxide semiconductor (CMOS) device, comprising:

an arrangement of a plurality of vertical fins on a substrate, wherein the plurality of vertical fins are made of a semiconductor material;

a first set of source/drain bases directly in contact with a first subset of vertical fins, wherein the first set of source/drain bases is silicon (Si);

a second set of source/drain base directly in contact with a second subset of vertical fins, wherein the second set of source/drain bases is silicon germanium (SiGe) having a germanium concentration in the range of about 30 at.% Ge to about 60 at.% Ge;

an isolation region in the substrate between the first subset of vertical fins and the second subset of vertical fin;

a first source/drain projection on each of the first set of source/drain bases;

a second source/drain projection on each of the second set of source/drain bases;

a first gate structure on each of the first source/drain projections;

a second gate structure on each of the second source/drain projections; and n-type source/drains on each of the first set of source/drain bases and in contact with the first source/drain projection, and p-type source/drains on each of the second set of source/drain bases and in contact with the second source/drain projection, wherein the source/drains are on opposite sides of each gate structure.

10. The complementary metal oxide semiconductor (CMOS) device of claim 9, wherein the substrate is single crystal silicon.

11. The complementary metal oxide semiconductor (CMOS) device of claim 9, wherein the first set of source/drain bases is single crystal silicon, and the second set of source/drain bases is single crystal silicon-germanium.

12. The complementary metal oxide semiconductor (CMOS) device of claim 11, wherein at least one of the source/drains on each of the first set of source/drain bases is electrically coupled with at least one of the source/drains on each of the second set of source/drain bases to form the complementary metal oxide semiconductor (CMOS) device.

13. A complementary metal oxide semiconductor (CMOS) device, comprising:

an arrangement of a plurality of vertical fins on a substrate, wherein the plurality of vertical fins are arranged in four subsets;

a first set of source/drain bases directly in contact with a first subset of vertical fins and a second subset of vertical fins, wherein the first set of source/drain bases is silicon (Si);

a second set of source/drain base directly in contact with a third subset of vertical fins and a fourth subset of vertical fins, wherein the second set of source/drain bases is silicon germanium (SiGe);

a first source/drain projection on each of the first set of source/drain bases, wherein the first source/drain projections are silicon (Si);

a second source/drain projection on each of the second set of source/drain bases wherein the second source/drain projections are silicon germanium (SiGe);

an isolation region in the substrate between the first subset of vertical fins and the second subset of vertical fins, wherein a top surface of the first set of source/drain bases is coplanar with a top surface of the isolation region and a top surface of the second set of source/drain bases is below the top surface of the isolation region; and source/drains on each of the first set of source/drain bases and source/drains on each of the second set of source/drain bases.

14. The complementary metal oxide semiconductor (CMOS) device of claim 13, wherein the first set of source/drain bases is single crystal silicon and the second set of source/drain bases is single crystal silicon germanium.

15. The complementary metal oxide semiconductor (CMOS) device of claim 14, wherein the second set of source/drain bases has a germanium concentration in the range of about 30 at.% Ge to about 60 at.% Ge.

16. The complementary metal oxide semiconductor (CMOS) device of claim 14, wherein the four subsets of vertical fins are arranged in a rectangular or square 2×2 arrangement.

17. The complementary metal oxide semiconductor (CMOS) device of claim 16, wherein the source/drains on each of the first set of source/drain bases are n-type, and the source/drains on each of the second set of source/drain bases are p-type.

18. The complementary metal oxide semiconductor (CMOS) device of claim 17, wherein at least one of the source/drains on each of the first set of source/drain bases is electrically coupled with at least one of the source/drains on each of the second set of source/drain bases to form the complementary metal oxide semiconductor (CMOS) device.

* * * * *